(12) United States Patent
Konishi et al.

(10) Patent No.: US 9,178,125 B2
(45) Date of Patent: Nov. 3, 2015

(54) LIGHT-EMITTING APPARATUS

(71) Applicant: Sharp Kabushiki Kaisha, Osaka-shi (JP)

(72) Inventors: Masahiro Konishi, Osaka (JP); Masaki Kondo, Osaka (JP); Takaaki Horio, Osaka (JP); Takanobu Matsuo, Osaka (JP); Toshio Hata, Osaka (JP); Kiyohisa Ohta, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 14/467,836

(22) Filed: Aug. 25, 2014

(65) Prior Publication Data

US 2014/0361331 A1    Dec. 11, 2014

Related U.S. Application Data

(60) Continuation of application No. 14/105,638, filed on Dec. 13, 2013, now Pat. No. 8,835,970, which is a division of application No. 12/490,192, filed on Jun. 23, 2009, now Pat. No. 8,680,546.

(30) Foreign Application Priority Data

Jun. 24, 2008   (JP) .................................. 2008-164910
Oct. 20, 2008   (JP) .................................. 2008-269858

(51) Int. Cl.
*H01L 33/00*    (2010.01)
*H01L 33/60*    (2010.01)
(Continued)

(52) U.S. Cl.
CPC ................ *H01L 33/60* (2013.01); *H01L 24/97* (2013.01); *H01L 33/56* (2013.01); *F21K 9/13* (2013.01);

(Continued)

(58) Field of Classification Search
CPC .. H01L 31/0522; H01L 31/0527; H01L 33/10
USPC ..................................................... 257/98–100
See application file for complete search history.

(56) References Cited

U.S. PATENT DOCUMENTS 6,486,561 B1    11/2002   Fuwausa et al.
8,029,439 B2    10/2011   Todd et al.
(Continued)

FOREIGN PATENT DOCUMENTS

CN    1992364        7/2007
JP    2001-284642    10/2001
(Continued)

OTHER PUBLICATIONS

Hitachi Cable (Hitachi Cable, Ltd.), "Hitachi Cable has developed a high-luminosity red LED chip 65 lumens/watt", News Release: Products, [online], Dec. 17, 2007, Hitachi Cable, Ltd.,(with partial English translation) located at http://www.hitachi-cable.co.jp/products/news/20071217/.html visited on May 1, 2008.
(Continued)

*Primary Examiner* — Elias M Ullah
(74) *Attorney, Agent, or Firm* — Morrison & Foerster LLP

(57) ABSTRACT

A light-emitting apparatus of the present invention has (i) a semiconductor device which emits light toward a higher position than a substrate and (ii) a plurality of external connection terminals, and includes: a light-reflecting layer, provided on the substrate, which reflects the light emitted by the semiconductor device; and a covering layer which covers at least the light-reflecting layer and which transmits the light reflected by the light-reflecting layer. Further, the semiconductor device is provided on the covering layer, and is electrically connected to the external connection terminals via connecting portions, and the semiconductor device and the connecting portions are sealed with a sealing resin so as to be covered. Therefore, the light-emitting apparatus has increased efficiency with which light is taken out, and can prevent a reflecting layer from being altered, deteriorating, and decreasing in reflectance.

5 Claims, 15 Drawing Sheets

(51) Int. Cl.
  *H01L 23/00* (2006.01)
  *H01L 33/56* (2010.01)
  *F21Y 101/02* (2006.01)
  *H01L 25/075* (2006.01)
  *H01L 33/46* (2010.01)
  *F21K 99/00* (2010.01)

(52) U.S. Cl.
  CPC ......... *F21Y 2101/02* (2013.01); *H01L 25/0753* (2013.01); *H01L 33/46* (2013.01); *H01L 2224/48091* (2013.01); *H01L 2224/48227* (2013.01); *H01L 2224/48228* (2013.01); *H01L 2224/49113* (2013.01); *H01L 2224/73265* (2013.01); *H01L 2224/97* (2013.01); *H01L 2924/0102* (2013.01); *H01L 2924/0103* (2013.01); *H01L 2924/0104* (2013.01); *H01L 2924/01005* (2013.01); *H01L 2924/01006* (2013.01); *H01L 2924/01012* (2013.01); *H01L 2924/01013* (2013.01); *H01L 2924/01024* (2013.01); *H01L 2924/01033* (2013.01); *H01L 2924/01038* (2013.01); *H01L 2924/01047* (2013.01); *H01L 2924/01056* (2013.01); *H01L 2924/01058* (2013.01); *H01L 2924/01063* (2013.01); *H01L 2924/01074* (2013.01); *H01L 2924/01078* (2013.01); *H01L 2924/01079* (2013.01); *H01L 2924/09701* (2013.01); *H01L 2924/12041* (2013.01); *H01L 2924/15787* (2013.01); *H01L 2924/15788* (2013.01); *H01L 2924/19107* (2013.01)

(56) References Cited

U.S. PATENT DOCUMENTS

| | | |
|---|---|---|
| 2001/0028062 A1 | 10/2001 | Uemura et al. |
| 2003/0151058 A1 | 8/2003 | Uemura et al. |
| 2005/0133799 A1 | 6/2005 | Uemura et al. |
| 2005/0225222 A1 | 10/2005 | Mazzochette et al. |
| 2006/0012299 A1 | 1/2006 | Suehiro et al. |
| 2006/0065879 A1 | 3/2006 | Beimel |
| 2006/0234023 A1 | 10/2006 | Endou et al. |
| 2007/0057364 A1 | 3/2007 | Wang et al. |
| 2007/0064429 A1 | 3/2007 | Mazzochette et al. |
| 2007/0145401 A1 | 6/2007 | Ikehara |
| 2007/0200133 A1 | 8/2007 | Hashimoto et al. |
| 2008/0093117 A1 | 4/2008 | Oikawa et al. |
| 2008/0254650 A1 | 10/2008 | Kadotani et al. |
| 2008/0259641 A1 | 10/2008 | Suzuki et al. |
| 2009/0065763 A1 | 3/2009 | Kamiyama et al. |
| 2009/0140405 A1 | 6/2009 | Maruo et al. |
| 2009/0283794 A1 | 11/2009 | Mizuno et al. |

FOREIGN PATENT DOCUMENTS

| | | |
|---|---|---|
| JP | 2004-509470 | 3/2004 |
| JP | 2004-200537 | 7/2004 |
| JP | 2004-266168 | 9/2004 |
| JP | 2005-209763 | 8/2005 |
| JP | 2005-244152 | 9/2005 |
| JP | 2006-100444 | 4/2006 |
| JP | 2006-128511 | 5/2006 |
| JP | 2007-129191 | 5/2007 |
| JP | 2007-533082 | 11/2007 |
| JP | 2007-324256 | 12/2007 |
| JP | 2008-71955 | 3/2008 |
| JP | 2008-78401 | 4/2008 |
| JP | 2008-109079 | 5/2008 |
| WO | WO-2007/136097 | 11/2007 |

OTHER PUBLICATIONS

Konishi et al., U.S. Restriction Requirement mailed Sep. 26, 2011, directed to U.S. Appl. No. 12/490,192; 6 pages.

Konishi et al., U.S. Office Action mailed Nov. 14, 2011, directed to U.S. Appl. No. 12/490,192; 15 pages.

Konishi et al., U.S. Office Action mailed Apr. 25, 2012, directed to U.S. Appl. No. 12/490,192; 15 pages.

Konishi et al., U.S. Advisory Action mailed Jul. 31, 2012, directed to U.S. Appl. No. 12/490,192; 3 pages.

Konishi et al., U.S. Office Action mailed Feb. 15, 2013, directed to U.S. Appl. No. 12/490,192; 18 pages.

Konishi et al., U.S. Notice of Allowance mailed Aug. 6, 2013, directed to U.S. Appl. No. 12/490,192; 6 pages.

Konishi et al., U.S. Notice of Allowance mailed Jan. 24, 2014, directed to U.S. Appl. No. 12/490,192; 5 pages.

Konishi et al., U.S. Notice of Allowance mailed May 13, 2014, directed to U.S. Appl. No. 14/105,638; 8 pages.

A-A' CROSS-SECTION

LIGHT-EMITTING APPARATUS

CROSS REFERENCE TO RELATED APPLICATIONS

This application is a continuation of U.S. application Ser. No. 14/105,638, filed Dec. 13, 2013, which is a divisional of U.S. application Ser. No. 12/490,192, filed Jun. 23, 2009, which claims priority under 35 U.S.C. §119(a) on Patent Application No. 2008-164910 filed in Japan on Jun. 24, 2008 and Patent Application No. 2008-269858 filed in Japan on Oct. 20, 2008, the entire contents of which are hereby incorporated by reference.

TECHNICAL FIELD

The present invention relates light-emitting apparatuses each including a light-emitting diode (LED) chip and a reflecting layer for efficiently taking out light emitted by the LED. In particular, the present invention relates to a light-emitting apparatus that prevents the reflecting layer from being altered, deteriorating, and decreasing in reflectance.

BACKGROUND ART

FIG. 11 is a cross-sectional view illustrating a conventional light-emitting apparatus in which an LTCC (low temperature co-fired ceramic) substrate is used (see Patent Literature 1). The light-emitting apparatus includes an LTCC substrate 50, silver epoxy 52, reflecting barriers 51, transparent epoxy 53, and LED dies 54. In this conventional example, light emitted by an LED die 54 is reflected by a reflecting barrier 51, whereby a reduction in loss of the emitted light is achieved. Further, heat from the LED die 54 is dissipated by the reflecting barrier 51 into a related thermal diffusion section (not shown) and the LTCC substrate 50. LTCC packaging of a light-emitting apparatus in which an LTCC substrate is used is suitable in particular to diffusing heat generated by closely-packed LED dies or LED arrays.

FIG. 12 is a cross-sectional view illustrating an LTCC chip carrier having wire bonding (see Patent Literature 2). This LTCC chip carrier has a heat spreader 67, a second LTCC layer 61, and a top LTCC layer 60 stacked in this order on a motherboard 65. The top LTCC layer 60 has a cavity in the center thereof. In the cavity, a single LED chip 4 is fixed with an adhesive or the like on a thermal via 62 formed so as to pass through the second LTCC layer 61. The LED chip 4 is connected by wire bonding via a wire 90 to a second layer terminal 64 formed on the second LTCC layer 61. The second layer terminal 64 is connected via a via 68 to a top terminal 63 formed on the top LTCC layer 60. Furthermore, the top terminal 63 is connected by wire bonding via a wire 91 to an external terminal 66 formed on the motherboard 65. The top terminal 63, the second layer terminal 64, the external terminal 66, and the heat spreader 67 are made of conductors that can be co-fired. The cavity inside the top LTCC layer 60 that contains the LED chip is sealed with epoxy resin 69 or another type of organic material. Furthermore, for a thermal runaway, a heat sink 70 is placed below the motherboard 65 by a variety of methods.

LTCC intrinsically has higher thermal conductivity than organic material. Further, the provision of the thermal via 62 and a metalized conductor surface causes a further increase in thermal conductivity, thus enabling an improvement in heat radiation properties of the light-emitting apparatus.

Further, as a technique for improving the luminous efficiency of an LED, a technique of providing a metal reflecting layer between a light-emitting layer of the LED and a supporting substrate has been proposed (Non Patent Literature 1). This means that the reflection by the metal reflecting layer of light radiated from the LED toward the supporting substrate enables an increase in the amount of light that is emitted by the LED.

CITATION LIST

Patent Literature 1
Japanese Translation of PCT International Publication, Tokuhyo, No. 2007-533082 A (Publication Date: Nov. 15, 2007)
Patent Literature 2
Japanese Patent Application Publication, Tokukai, No. 2007-129191 A (Publication Date: May 24, 2007)
Non Patent Literature 1
HITACHI Cable (Hitachi Cable, Ltd.), "Hitachi Cable has developed a high-luminosity red LED chip 65 lumens/watt", News Release: Products, [online], Dec. 17, 2007, Hitachi Cable, Ltd., [retrieved on May 1, 2008] Internet (http://www.hitachi-cable.co.jp/products/news/20071217.html)

SUMMARY OF INVENTION

Technical Problem

However, the conventional arrangements cause the following problems.

An LTCC substrate is a substrate made of a composite of ceramic and glass. Depending on the material, the LTCC substrate transmits or absorbs light emitted by an LED chip, thereby causing a decrease in emission output. However, the conventional arrangements of Patent Literatures 1 and 2 take no measures against light reflection or light transmission on a surface of an LTCC substrate. Further, since the conventional arrangements are each structured to have a step beside a surface on which an LED chip is mounted, thus causing a loss in emitted light. Therefore, the conventional arrangements are not arranged to realize a high-power LED.

Further, in the arrangement of Non Patent Literature 1, unfortunately, the metal reflecting layer is altered or deteriorates, for example, due to external moisture or oxygen and further decreases in reflectance due to the alteration or deterioration.

The present invention has been made in view of the foregoing problems, and it is an object of the present invention to provide a light-emitting apparatus that has increased efficiency with which light is taken out and that prevents a reflecting layer from being altered, deteriorating, and decreasing in reflectance.

Solution to Problem

A light-emitting apparatus according to the present invention has (i) at lease one semiconductor device which emits light toward a higher position than a substrate and (ii) a plurality of external connection terminals, and includes: a light-reflecting layer, provided on the substrate, which reflects the light emitted by the at lease one semiconductor device; and a covering layer which covers at least the light-reflecting layer and which transmits the light reflected by the light-reflecting layer. The at least one semiconductor device is provided on the covering layer, and is electrically connected to the external connection terminals via connecting portions, and the at least one semiconductor device and the connecting portions are sealed with a sealing resin so as to be covered.

According to the foregoing arrangement, the light-reflecting layer reflects light emitted by the semiconductor device toward a lower position (toward the substrate), thereby enabling effective use of the emitted light with a reduction in loss of the emitted light. This makes it possible to increase the amount of light that is emitted by the light-emitting apparatus. Further, since the light-reflecting layer is covered with the covering layer, the light-emitting apparatus inhibits the light-reflecting layer from being altered or deteriorating. Furthermore, the light-emitting apparatus inhibits a decrease in reflectance from being caused by the alteration or deterioration.

A light-emitting apparatus according to the present invention includes: a light-emitting diode chip; a package, including a chip-mounting portion and a silver reflecting layer which reflects light emitted by the light-emitting diode chip, in which the light-emitting diode chip is die-bonded to the chip-mounting portion; and a sealing resin which covers the light-emitting diode chip, the silver reflecting layer being covered with a glass layer.

A method according to the present invention for manufacturing a package for a light-emitting apparatus includes the steps of: preparing a plurality of green sheets made mainly of alumina; performing a process of making holes in the plurality of green sheets; filling the holes of the plurality of green sheets with at least either metal paste or glass paste; and stacking and firing the plurality of green sheets so that the metal paste is covered with the glass paste, the steps being executed in the order presented.

Advantageous Effects of Invention

In the light-emitting apparatus according to the present invention, the light-reflecting layer reflects light emitted by the semiconductor device toward a lower position (toward the substrate), thereby enabling effective use of the emitted light with a reduction in loss of the emitted light. This makes it possible to increase the amount of light that is emitted by the light-emitting apparatus. Further, since the light-reflecting layer is covered with the covering layer, the light-emitting apparatus inhibits the light-reflecting layer from being altered or deteriorating. Furthermore, the light-emitting apparatus inhibits a decrease in reflectance from being caused by the alteration or deterioration.

Further, the light-emitting apparatus according to the present invention sufficiently protects the light-reflecting layer by the covering layer, thus making it possible to apply dimethyl silicone or methyl rubber as the sealing resin. Dimethyl silicone and methyl rubber are somewhat lower in gas sealing properties in some cases, but exhibit high heat resistance and a high degree of adhesion to glass.

In the method according to the present invention for manufacturing a package for a light-emitting apparatus, at the same time as a substrate material obtained by stacking green sheets is fired, a reflecting layer and a covering layer covering the reflecting layer are fired, whereby a package for a light-emitting apparatus is manufactured. This makes it unnecessary to execute more than one firing step, thus achieving a low cost.

For a fuller understanding of the nature and advantages of the invention, reference should be made to the ensuing detailed description taken in conjunction with the accompanying drawings.

BRIEF DESCRIPTION OF DRAWINGS

FIG. 13(b) is a cross-sectional view schematically illustrating the light-emitting apparatus.

DESCRIPTION OF EMBODIMENTS

Embodiment 1

Figure 1:
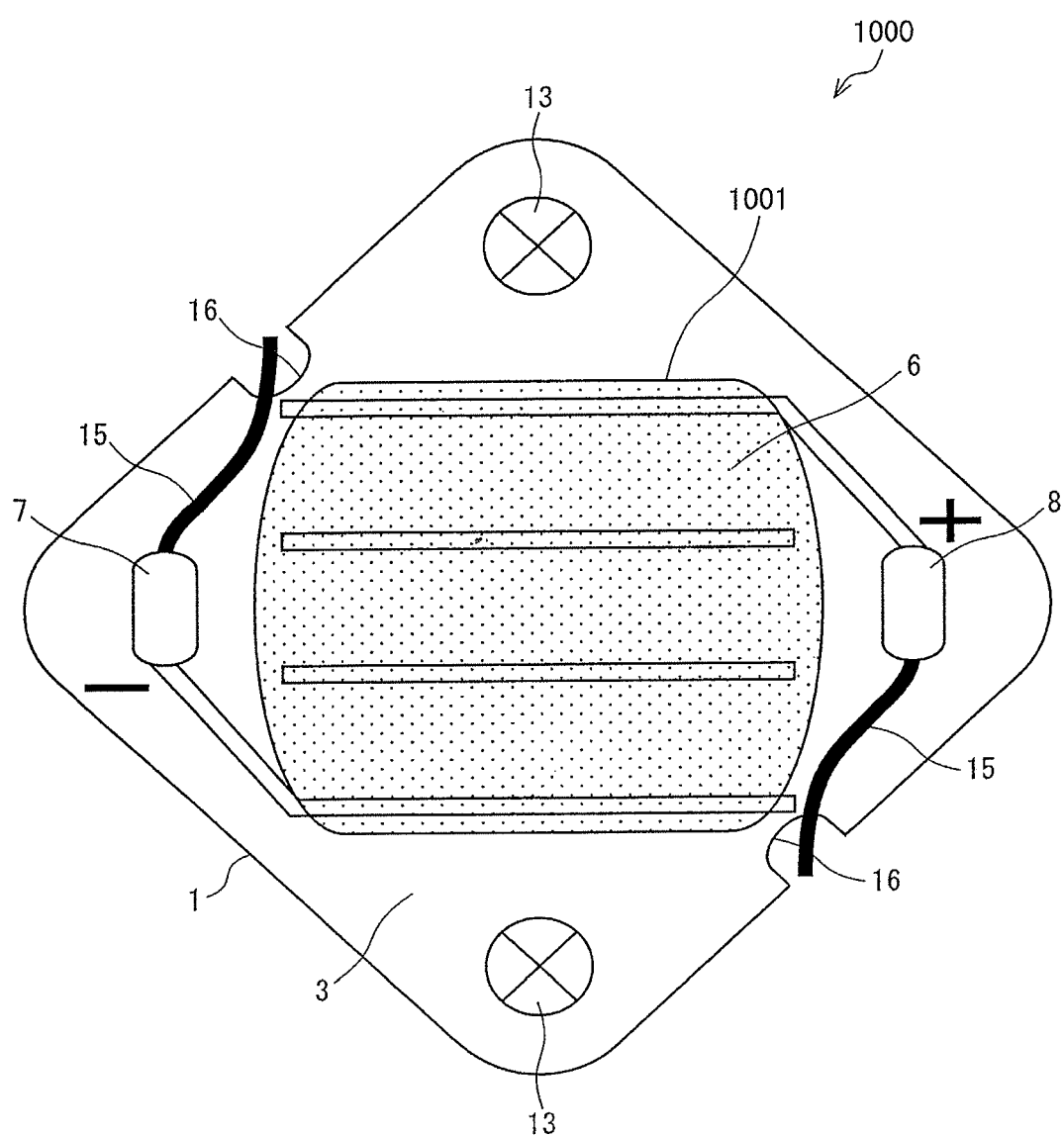
FIG. 1 is a plan view schematically illustrating a light-emitting apparatus according to one embodiment of the present invention.

FIG. 1 shows an overhead pattern diagram of a light-emitting apparatus 1000 according to one embodiment of the present invention. The light-emitting apparatus 1000 includes a low temperature co-fired ceramic (LTCC) substrate 1. On the low temperature co-fired ceramic (LTCC) substrate 1, a silver reflecting layer (not illustrated) and a glass layer (covering layer) 3 are formed in this order. The light-emitting apparatus 1000 has a light-emitting section 1001 provided on the glass layer 3. The light-emitting section 1001 is sealed with a luminescent material-containing sealing resin 6. Further provided on the LTCC substrate 1 are a positive electrode external connection terminal 8 and a negative electrode external connection terminal 7. Each of the external connection terminals has an external wire 15 connected thereto. The external wire 15 is run outward through an external wiring hole 16 provided in the LTCC substrate 1. The LTCC substrate 1 has attaching portions 13 via which the light-emitting apparatus 1000 is screwed to another apparatus. It should be noted here that the outer shape of the light-emitting apparatus 1000 is substantially square and the shape of the light-emitting section 1001 is substantially rectangular.

Figure 2:
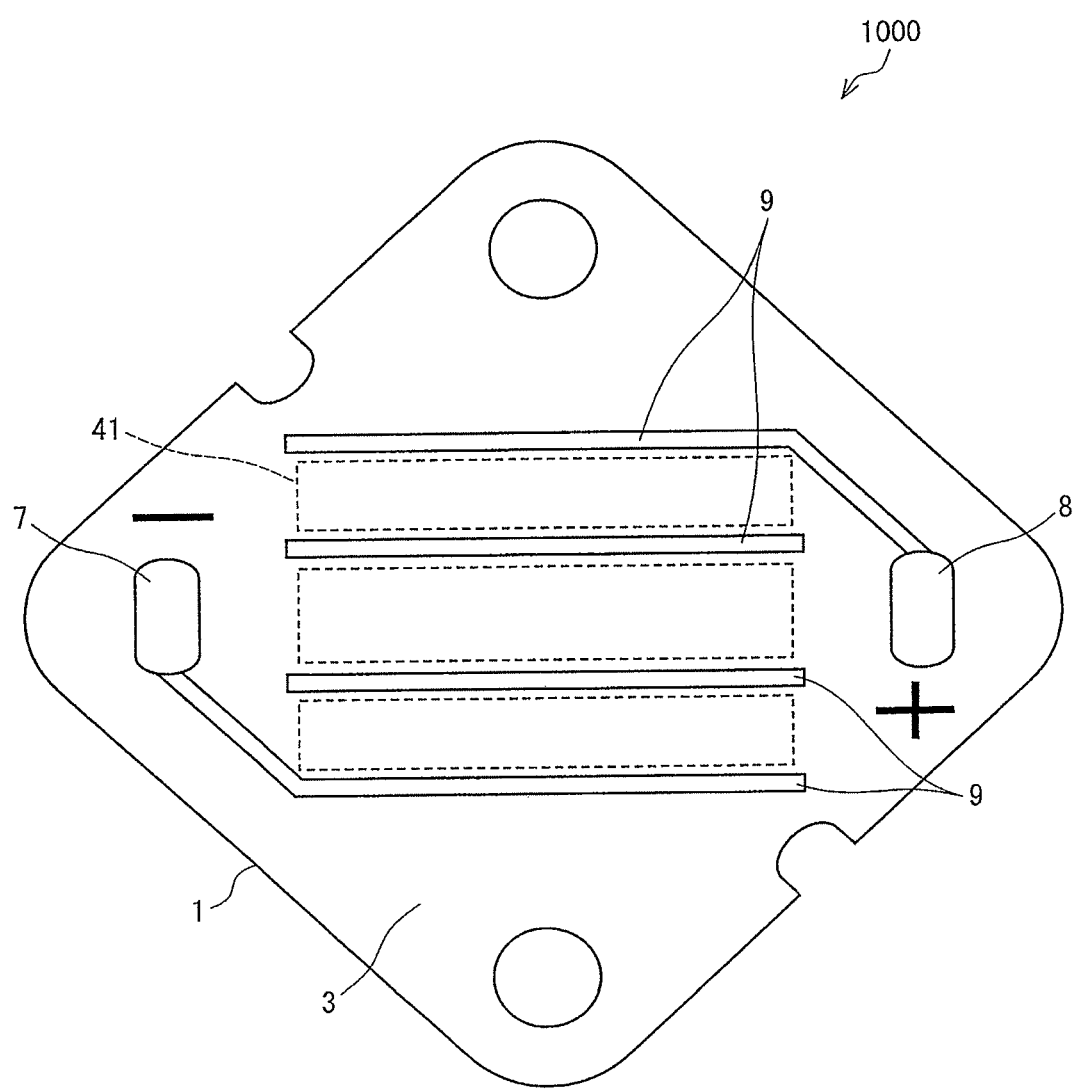
FIG. 2 is a plan view schematically illustrating wiring patterns of a light-emitting section of the light-emitting apparatus.

FIG. 2 is a plan view illustrating wiring patterns or the like of the light-emitting apparatus 1000. On the glass layer 3 formed on the LTCC substrate 1, a plurality of elongated rectangular wiring patterns (connecting portions) 9 are formed in parallel with one another and at distances from one another. The wiring patterns 9 are connected to the positive electrode external connection terminal 8 and the negative electrode external connection terminal 7. Provided between one wiring pattern 9 and another is a chip-mounting portion 41 on which an LED chip (semiconductor device) is mounted.

Figure 3:
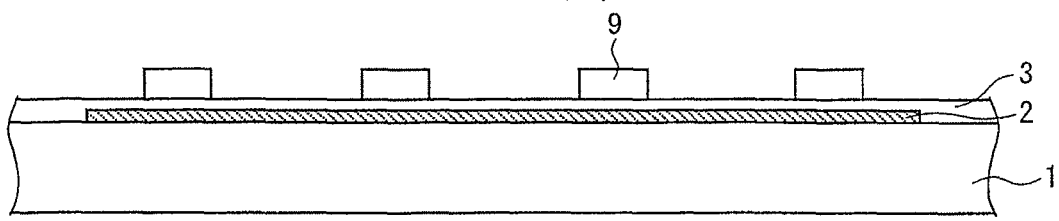
FIGS. 3(a) through 3(d) are cross-sectional views schematically illustrating steps of manufacturing the light-emitting apparatus.
Figure 3:
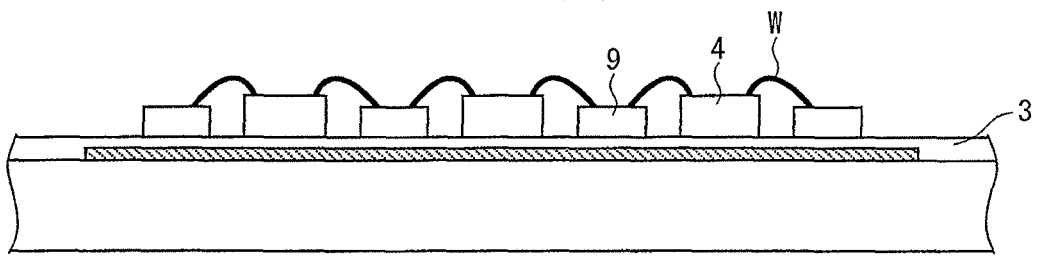
Figure 3:
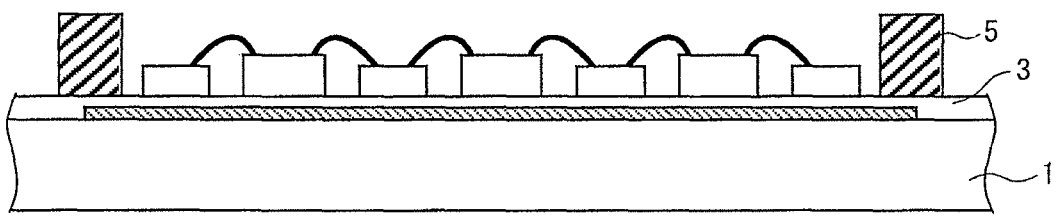
Figure 3:
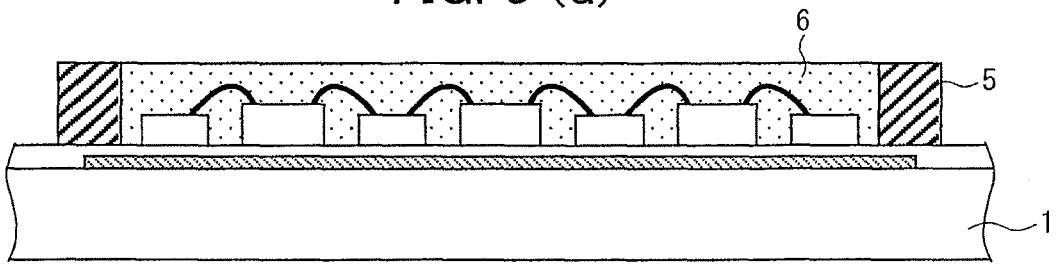
Figure 4:
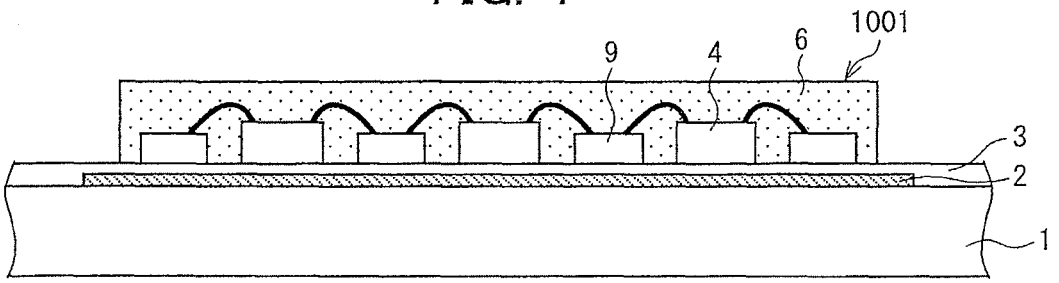
FIG. 4 is a cross-sectional view schematically illustrating the light-emitting apparatus.

FIGS. 3(*a*) through 3(*d*) and FIG. 4 are cross-sectional views schematically illustrating a method for manufacturing a light-emitting apparatus 1000.

FIG. 3(*a*): On an LTCC substrate 1 having a thickness of 2 mm, a silver film is formed by plating, whereby a silver reflecting layer (light-reflecting layer) 2 having a thickness of 0.2 mm is formed.

On the silver reflecting layer 2, a glass layer 3 having a thickness of 0.006 mm is formed.

On the glass layer 3, wiring patterns 9 (thickness 0.07 mm, width 0.45 mm, interval 2 mm) are formed by screen printing. The method used here is a method to impart wettability to a surface of the glass layer by cleaning the surface without roughening it, to provide the surface with special treatment that strengthens a chemical bond, to make the surface catalytically active, and to then plate the surface directly with electroless nickel adjusted for glass material.

It should be noted here that the LTCC substrate 1 is made of a mixture of borosilicate glass ($Na_2O$—$B_2O_3$—$SiO_2$) and $SiO_2$. The silver reflecting layer 2 is made of silver or a silver alloy (Ag, AgPt, Ag—Bi, Ag—Nd based alloy) composed mainly of silver. The glass layer 3 is made of transparent borosilicate glass ($Na_2O$—$B_2O_3$—$SiO_2$) with use of a doctor blade method. The doctor blade method is one of the methods for forming ceramic into sheets. This molding method regulates a space between an edge of a knife (doctor blade) and a carrier (carrier film, endless belt), and precisely controls the thickness of a slip (slurried slip or gel obtained by dispersing raw powder in a solvent) conveyed on the carrier. Refer to: http://www.oit.ac.jp/www-ee/server/aplab/res/slurry.html).

FIG. 3(*b*): Between one wiring pattern 9 and another on the glass substrate 3, LED chips 4 (shorter-side width 0.24 mm, longer-side width 0.48 mm, thickness 0.14 mm, quantity 36) are fixed with use of silicone resin. Next, the LED chips 4 and the wiring patterns 9 are electrically connected with use of bonding wires (connecting portions) W. It should be noted that each of the LED chips 4 includes an arrangement of a commonly-used LED chip.

FIG. 3(*c*): A substantially rectangular silicone rubber sheet 5 is disposed onto the glass layer 3 so as to surround a region in which the LED chips have been placed. The silicone rubber sheet 5 is attached firmly onto the glass layer 3.

FIG. 3(*d*): Next, a sealing resin (silicone) 6 containing a luminescent material (Eu:BOSE (($Ba.Sr)_2SiO_4$:Eu)) is injected into an inner side surrounded by the silicone rubber sheet 5, and the sealing resin containing the luminescent material is cured by heat.

Here, after a mixture of a luminescent substance and silicone resin that is a transparent resin is injected into the frame constructed by the silicone rubber sheet 5, the resin is cured over 30 minutes at 150° C., with the result that a sealing resin 6 containing a luminescent material is formed. After that, the silicone rubber sheet 5 is removed.

FIG. 4 is a cross-sectional view illustrating a light-emitting section 1001 thus formed on the LTCC substrate 1.

The sealing resin 6 containing the luminescent material is formed so as to give off light corresponding to the point (x,y)=(0.345,0.35) on the CIE chromaticity diagram. Thus, the light-emitting section 1001 is manufactured.

Such an arrangement as above allows light emitted by the LED chips 4 or, in particular, light from the lower surfaces of the LED chips 4 (toward the substrate) to be reflected by the silver reflecting layer 2 sandwiched between the LTCC substrate 1 and the glass substrate 3, thus losslessly making effective use of the light emitted by the LED chips 4. This makes it possible to increase the amount of light that is emitted by the light-emitting apparatus 1000. Further, the silver reflecting layer 2 both functions as a light-reflecting layer and functions to diffuse, in a direction along a surface of the package (i.e., in a direction parallel to the LTCC substrate 1), heat generated by the LED chips 4. Further, since the LTCC substrate 1 has high heat conductivity and good heat radiation properties, the LED chips 4 can be integrated. This makes it possible to inhibit the light-emitting apparatus from being deformed due to heat, thus enabling suppression of a color shift or the like.

Further, in the present embodiment, the silver reflecting layer 2 is covered with the glass layer 3; therefore, the glass layer 3 can inhibit the reflecting layer from being altered, deteriorating, and decreasing in reflectance. The glass layer 3 is more highly isolating against oxygen, moisture, or the like than a common resin is. Therefore, the glass layer 3 can suppress a change over time in the silver reflecting layer 2. Further, since the LTCC substrate 1 and the glass layer 3 both contain glass, the LTCC substrate and the glass layer exhibit satisfactory adhesion to each other, thus further enhancing the effect of isolating the silver reflecting layer 2 from oxygen, moisture, or the like.

The reflecting layer can be made of any metal or nonmetallic material that reflects light emitted by the LED chips, as well as the aforementioned silver or silver alloy. For example, when the reflecting layer is made of a given metal or nonmetallic material having an optical reflectance of not less than 90%, light emitted toward the LTCC substrate 1 can be efficiently used, so that the amount of light that is emitted by the light-emitting section 1001 can be increased.

Further, it is preferable that the wiring patterns 9 be made of a material containing gold, which is chemically stable. Furthermore, the present embodiment has a nickel layer formed between the wiring patterns 9 and the glass layer 3, thus improving adhesion between the wiring patterns 9 made of gold and the glass layer 3. This makes it possible to further inhibit a change over time from being caused by deterioration or the like in the wiring patterns 9. Alternatively, instead of the nickel layer, a chrome layer may be formed.

It should be noted here that it is preferable that the glass layer 3 and the LTCC substrate 1 be made of glass powder of borosilicate glass of the composition $Na_2O$—$B_2O_3$—$SiO_2$, because the borosilicate glass is low in coefficient of thermal expansion, high in thermal shock temperature, and highly chemically resistant because of its high content of boron oxide.

The silicone rubber sheet 5 (see FIG. 3(d)) functions as a dam (to stop the resin from leaking) in applying the transparent resin containing the luminescent material. As such, the silicone rubber sheet 5 is characterized in such a way as to be called a dam sheet. Further, the dam sheet can be used a number of times. Further, the dam sheet is characterized in that changes in shape of the dam sheet easily allow variations in shape of the light-emitting section 1001 (i.e., shape of the luminescent material-containing sealing resin 6).

The glass layer 3 and the silver reflecting layer 2 are formed across the whole surface, surrounded by the silicone rubber sheet 5, on which the LED chips 4 have been mounted.

It should be noted here that since such an arrangement of the region in which the LED chips 4 are mounted makes it possible to freely determine the pitches at which the LED chips are placed along a direction parallel to the wiring patterns 9, it is possible to easily adjust the luminance of the light-emitting apparatus, adjust the chromaticity of the light-emitting apparatus, and take measures against heat generated by the light-emitting apparatus.

Figure 5:
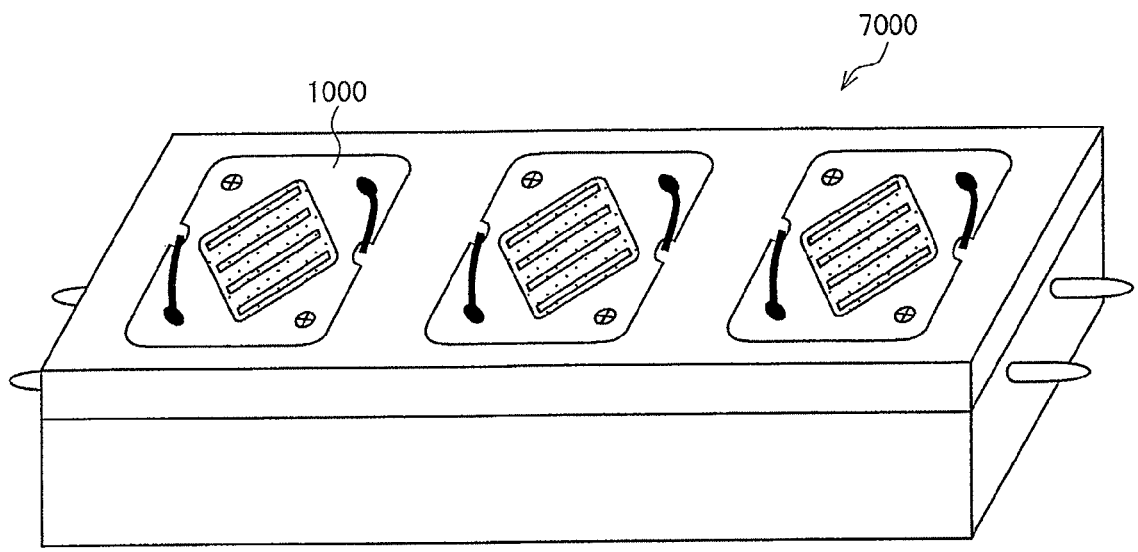
FIG. 5 is a perspective view illustrating an LED light fixture, shaped into a fluorescent light, in which the light-emitting apparatus is used.
Figure 6:
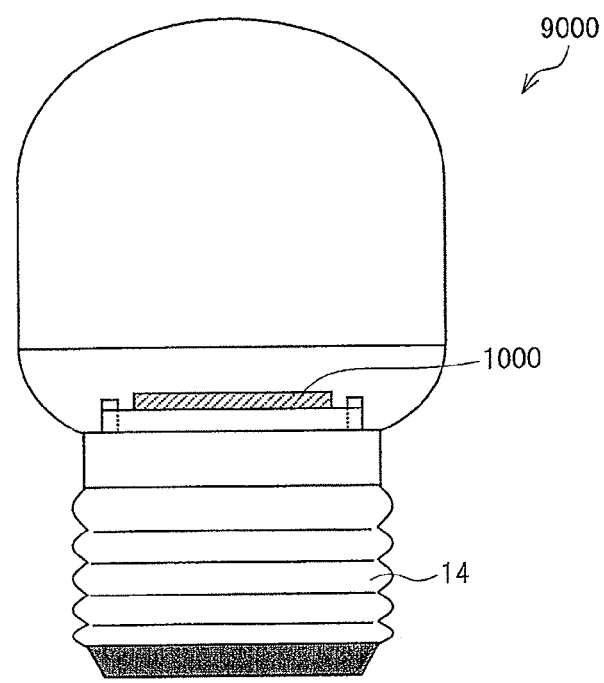
FIG. 6 is a perspective view illustrating an LED light fixture, shaped into a light bulb, in which the light-emitting apparatus is used.

As applied examples of a light fixture made with use of a light-emitting apparatus 1000, FIG. 5 shows a pattern diagram of an LED lamp 7000 shaped into a fluorescent light, and FIG. 6 shows a pattern diagram of an LED lamp 9000 shaped into a light bulb. The LED lamp 9000 has a thread 14. The LED lamp 7000 and the LED lamp 9000 are arranged in the same manner as a common LED lamp shaped into a fluorescent light and a common LED lamp shaped into a light bulb, respectively, except that they each include a light-emitting apparatus 1000.

Embodiment 2

Figure 7:
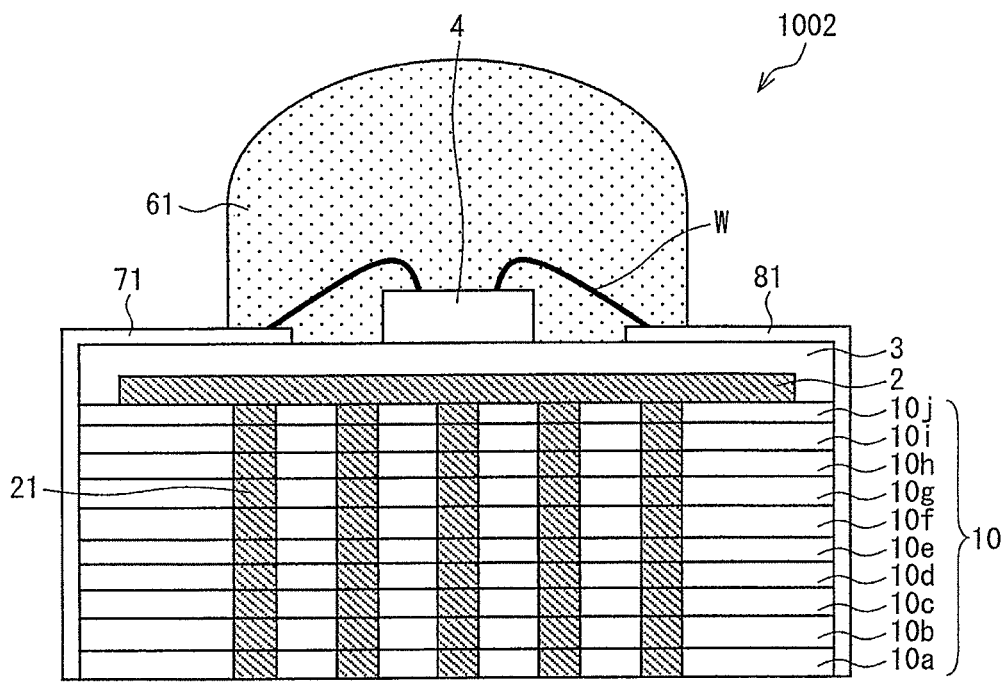
FIG. 7(a) is a cross-sectional view schematically illustrating a light-emitting apparatus according to another embodiment of the present invention.
FIG. 7(b) is a plan view schematically illustrating the light-emitting apparatus.
Figure 7:
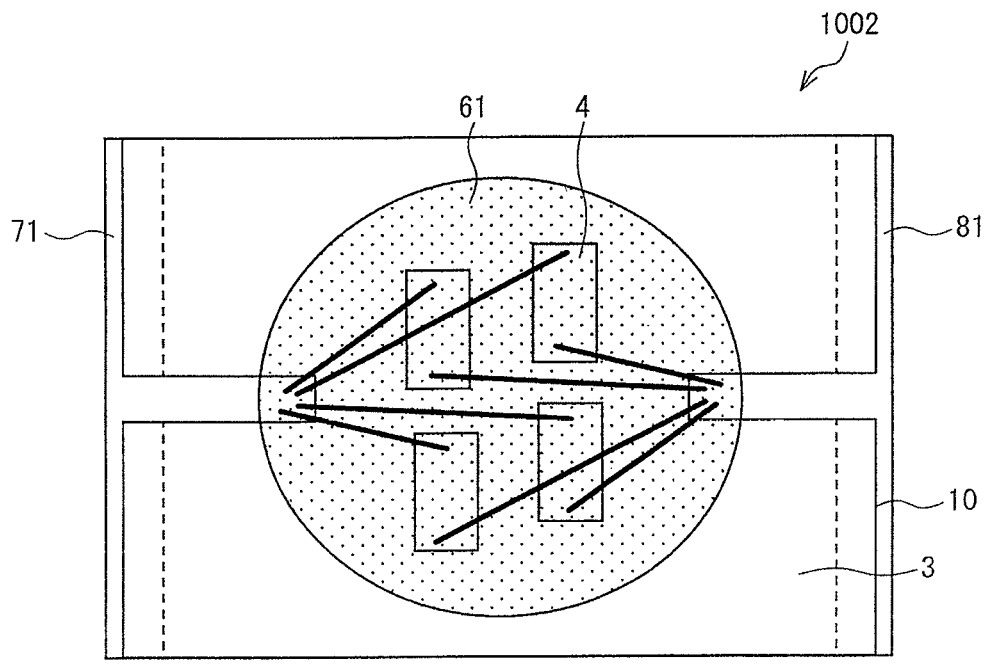

FIG. 7(a) is a cross-sectional view schematically illustrating a light-emitting apparatus 1002 according to another embodiment of the present invention, and FIG. 7(b) is a plan view illustrating the light-emitting apparatus 1002. For convenience of explanation, members having the same functions as those used in Embodiment 1 are given the same reference numerals, and will not be described below. The light-emitting apparatus 1002 includes: a low temperature co-fired ceramic (LTCC) substrate 10; a silver reflecting layer 2 formed on the LTCC substrate 10; a glass layer 3 covering the silver reflecting layer 2; LED chips 4 placed on the glass layer 3; and positive and negative electrode external connection terminals 81 and 71 formed on the glass layer 3. The LED chips 4 are electrically connected to each of the external connection terminals 81 and 71 via bonding wires W. The LED chips 4 and the bonding wires W are sealed with a domed luminescent material-containing sealing resin 61. The external connection terminals 81 and 71 are formed so as to extend to opposite side surfaces of the LTCC substrate 10.

The LTCC substrate 10 includes multiple (ten) LTCC layers 10a to 10j, and a plurality of heat-radiating vias 21 made of silver are each formed so as to pass through the layers of the LTCC substrate 10, i.e., so as to extend in a direction perpendicular to the LTCC substrate 10, and are each connected to the silver reflecting layer 2. It should be noted here that the LTCC substrate 10 is made by stacking ten green sheets. The present embodiment has four LED chips 4 placed therein. However, for simplicity, FIG. 7(a) shows a cross-section of a single LED chip.

The following shows a method for manufacturing a light-emitting apparatus 1002.

Step (1): Raw material is prepared by blending/mixing ceramic powder ($Al_2O_3$ powder, 30 wt %) and glass powder (borosilicate glass powder, 70 wt %) with a given ratio. To the raw material thus mixed, an organic binder (acrylic resin) and a solvent (toluene) are added, and then dispersed uniformly. Thus made is material, called slurry, which serves as a basis for a green sheet. The slurry is applied onto a PET film by a doctor blade molding machine so as to have a given thickness, and then reeled off after a drying step. A sheet-like material thus made is called a green sheet (thickness of 0.1 mm). The green sheet is cut to the proper size, and then subjected to a process (punching process) of making holes that are to serve as heat-radiating vias 21. The holes are filled with heat-radiating material (silver paste). Thus made is a single LTCC layer (thickness 0.1 mm). Ten LTCC layers (10a, 10b, 10c, 10d, 10e, 10f, 10g, 10h, 10i, 10j) thus made are stacked, pressure-bonded by heat, and then subjected to a firing step (850° C.). Thus made is an LTCC substrate 10.

Step (2): On the LTCC substrate 10 (thickness 1 mm), a silver film (thickness 0.25 mm) is formed by plating, whereby a silver reflecting layer 2 is formed. It should be noted here that the green sheet is made of glass powder of borosilicate glass ($Na_2O$—$B_2O_3$—$SiO_2$) and ceramic powder of $Al_2O_3$.

Step (3): On the silver reflecting layer 2, a glass layer 3 (thickness 0.01 mm) is formed. It should be noted here that the glass layer 3 is made of transparent borosilicate glass ($Na_2O$—$B_2O_3$—$SiO_2$) with use of a doctor blade method.

Step (4): On the glass layer 3, external connection terminals 71 and 81 (thickness 0.7 mm, width 0.45 mm) are formed with gold by screen printing.

Step (5): On the glass layer 3, LED chips 4 (shorter-side width 0.24 mm, longer-side width 0.48 mm, thickness 0.14 mm, quantity 4) are fixed with use of silicone resin (not illustrated). Next, the LED chips 4 and the external connection terminals 71 and 81 are electrically connected with use of bonding wires W.

Step (6): Next, a sealing resin (silicone) 61 containing a luminescent material (Eu:BOSE) is formed, and the luminescent material-containing sealing resin 61 is cured by heat. The luminescent material-containing sealing resin 61 is formed by keeping a mixture of a luminescent material and silicone resin that is a transparent resin at 150° C. over 30 minutes and curing the resin. It should be noted that, in the present embodiment, the luminescent material-containing sealing resin 61 is formed so as to give off light corresponding to the point (x,y)=(0.345,0.35) on the CIE chromaticity diagram. Thus, the light-emitting section is manufactured.

It should be noted here that the silver reflecting layer 2 is effective in taking out light emitted by the LED chips 4 toward the LTCC substrate 10. Further, in the present embodiment, the silver reflecting layer 2 is covered with the glass layer 3. This makes it possible to inhibit the reflecting layer from being altered, deteriorating, and decreasing in reflectance. The glass layer 3 is more highly isolating against oxygen, moisture, or the like than a common resin is, and therefore can suppress a change over time in the silver reflecting layer 2.

Further, the heat-radiating vias 21, made of silver, can effectively radiate heat outward so that heat generated by the LED chips 4 is transferred in a direction perpendicular to the substrate. This effect is more remarkable because the contact between the silver reflecting layer 2 and the heat-radiating vias 21 allows the heat generated by the LED chips 4 to be efficiently transferred to the heat-radiating vias 21 via the silver reflecting layer 2. The heat-radiating vias 21 can be made of any metal, as well as silver. Alternatively, as with the silver reflecting layer 2, the heat-radiating vias 21 may be made of a silver alloy (AgPt, Ag—Bi, Ag—Nd based alloy) composed mainly of silver.

Further, it is possible to place a heat sink (not illustrated) on the underside of the LTCC substrate 10 of the light-emitting apparatus 1002. Such a heat sink further increases the heat radiation properties of the light-emitting apparatus, thus inhibiting a color shift from being caused by generated heat. In such a case, it is preferable that the heat-radiating vias 21 be in contact with the heat sink.

It should be noted the heat-radiating vias 21 have an effect of reflecting light transmitted from the LED chip 4 into the LTCC substrate 10. When the heat-radiating vias 21 are disposed so as to extend to a region where the silver reflecting layer 2 is not formed as seen from a surface of the LTCC substrate 10, it is possible to better take out light toward the surface of the LTCC substrate 10.

Embodiment 3

Figure 8:
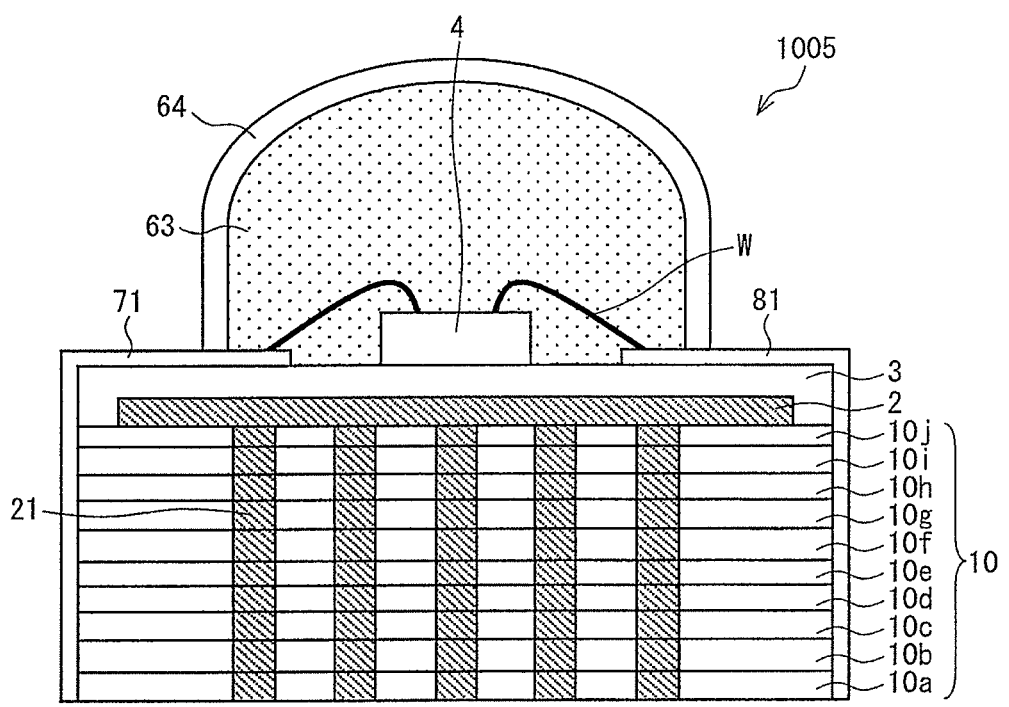
FIG. 8 is a cross-sectional view schematically illustrating a light-emitting apparatus according to still another embodiment of the present invention.

FIG. 8 is a cross-sectional view schematically illustrating a light-emitting apparatus 1005 according to another embodiment of the present invention. For convenience of explanation, members having the same functions as those used in Embodiment 2 are given the same reference numerals, and will not be described below. The present embodiment differs from Embodiment 2 in that the LED chips 4 and the bonding wires W are sealed with a domed sealing resin including a luminescent material-containing resin section 63 containing a luminescent material and a transparent resin section 64 formed so as to cover the luminescent material-containing resin section 63, instead of being sealed with the luminescent material-containing resin. The luminescent material-containing resin section 63 and the transparent resin section 64 are each domed.

Such an arrangement as above makes it possible to protect the luminescent material-containing resin section 63 by the transparent resin section 64. Further, since the sealing resin and each resin section are domed, there are continuous changes in direction in which irradiating light from the LED chip 4 is refracted. This makes it possible to reduce spatial unevenness in intensity of the irradiating light.

The transparent resin section 64 is preferably made of raw material capable of securing transparency and high in hardness, but is not particularly limited in material.

Embodiment 4

Figure 9:
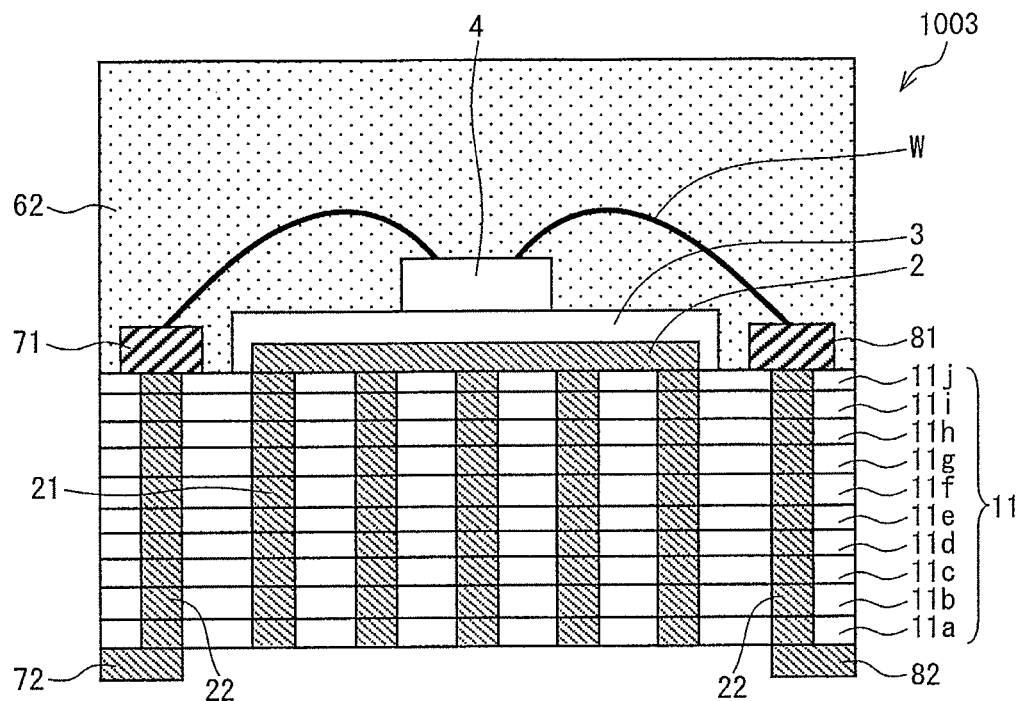
FIG. 9 is a cross-sectional view schematically illustrating a light-emitting apparatus according to still another embodiment of the present invention.

FIG. 9 is a cross-sectional view schematically illustrating a light-emitting apparatus 1003 according to another embodiment of the present invention. For convenience of explanation, members having the same functions as those used in Embodiment 2 are given the same reference numerals, and will not be described below. The light-emitting apparatus 1003 includes: a low temperature co-fired ceramic (LTCC) substrate 11; a silver reflecting layer 2 formed on the LTCC substrate 11; a glass layer 3 covering only the silver reflecting layer 2 on the LTCC substrate 11; LED chips 4 placed on the glass layer 3; and positive and negative electrode external connection terminals 81 and 71 formed on the LTCC substrate 11. The LED chips 4 are electrically connected to each of the external connection terminals 81 and 71 via bonding wires W. The LED chips 4, the external connection terminals 81 and 71, and the bonding wires W are sealed with a luminescent material-containing sealing resin 62. The LTCC substrate 11 includes multiple (ten) LTCC layers 11a to 11j, and a plurality of heat-radiating vias 21 made of silver are each formed so as to pass through the layers of the LTCC substrate 11, i.e., so as to extend in a direction perpendicular to the LTCC substrate 11, and are each connected to the silver reflecting layer 2. Further, the external connection terminals 81 and 71 are respectively connected to two wiring vias (heat-radiating vias) 22 passing through the LTCC substrate 11, and the wiring vias 22 are respectively connected to external terminals 82 and 72 formed on the underside of the LTCC substrate 11. It should be noted here that the LTCC substrate 10 is made by stacking ten green sheets. The present embodiment has four LED chips 4 placed therein. However, for simplicity, FIG. 9 shows a cross-section of a single LED chip.

The following shows a method for manufacturing a light-emitting apparatus 1003.

Step (1): Raw material is prepared by blending/mixing ceramic powder ($Al_2O_3$ powder, 30 wt %) and glass powder (borosilicate glass powder, 70 wt %) with a given ratio. To the raw material thus mixed, an organic binder (acrylic resin) and a solvent (toluene) are added, and then dispersed uniformly. Thus made is material, called slurry, which serves as a basis for a green sheet. The slurry is applied onto a PET film by a doctor blade molding machine so as to have a given thickness, and then reeled off after a drying step. A sheet-like material thus made is called a green sheet (thickness of 0.1 mm). The green sheet is cut to the proper size, and then subjected to a process (punching process) of making holes that are to serve as heat-radiating vias 21 and wiring vias 22. The holes that are to serve as heat-radiating vias 21 and wiring vias 22 are filled with material (silver paste). Thus made is a single LTCC layer (thickness 0.1 mm). Ten LTCC layers (11a, 11b, 11c, 11d, 11e, 11f, 11g, 11h, 11i, 11j) thus made are stacked, pressure-bonded by heat, and then subjected to a firing step (850° C.). Thus made is an LTCC substrate 11.

Step (2): On the LTCC substrate 11 (thickness 1 mm), a silver film 2 (thickness 0.25 mm) is formed by plating, whereby a silver reflecting layer 2 is formed. It should be noted here that the green sheet is made of glass powder of borosilicate glass ($Na_2O$—$B_2O_3$—$SiO_2$) and ceramic powder of $Al_2O_3$.

Step (3): On the silver reflecting layer 2, a glass layer 3 (thickness 0.007 mm) is formed. It should be noted here that the glass layer 3 is made of transparent borosilicate glass ($Na_2O$—$B_2O_3$—$SiO_2$) with use of a doctor blade method.

Step (4): On the wiring vias 22 of the LTCC substrate 11, external connection terminals 81 and 71 (thickness 0.7 mm, width 0.45 mm) are formed with gold by screen printing so that the glass layer 3 is interposed between the external connection terminals 81 and 71.

Step (5): On the glass layer 3, LED chips 4 (shorter-side width 0.24 mm, longer-side width 0.48 mm, thickness 0.14 mm, quantity 4) are fixed with use of silicone resin (not illustrated). The LED chips 4 and the external connection terminals 81 and 71 are electrically connected with use of bonding wires W.

Step (6): Next, a sealing resin (silicone) 62 containing a luminescent material (Eu:BOSE) is formed, and the luminescent material-containing sealing resin 62 is cured by heat. The luminescent material-containing sealing resin 62 is formed by keeping a mixture of a luminescent material and silicone resin that is a transparent resin at 150° C. over 30 minutes and curing the resin. It should be noted that, in the present embodiment, the luminescent material-containing sealing resin 62 is formed so as to give off light corresponding to the point (x,y)=(0.345,0.35) on the CIE chromaticity diagram. Thus, the light-emitting section is manufactured.

It should be noted here that heat from the LED chips 4 is transferred to the external connection terminals 81 and 71 via the bonding wires W. The external terminals 82 and 72, formed on the underside of the LTCC substrate 11, are connected to the external connection terminals 81 and 71 via the wiring vias 22, respectively, so that the heat transferred to the external connection terminals 81 and 71 is transferred to the external terminals 82 and 72 to be radiated. This effect is more remarkable because the contact between the external connection terminals 81 and 71 and the wiring vias 22 allows the heat generated by the LED chips 4 to be efficiently transferred to the wiring vias 22 via the bonding wires W. The wiring vias 22 can be made of any metal, as well as silver. Alternatively, as with the silver reflecting layer 2, the wiring vias 22 may be made of a silver alloy (AgPt, Ag—Bi, Ag—Nd based alloy) composed mainly of silver. It is because the glass layer 3 covers only the silver reflecting layer 2 that the wiring vias 22 can be provided to be connected to the external connection terminals 81 and 71 on the LTCC substrate 11.

It should be noted here that the silver reflecting layer 2 is effective in taking out light emitted by the LED chips 4 toward the LTCC substrate 11. Further, in the present embodiment, the silver reflecting layer 2 is covered with the glass layer 3. This makes it possible to inhibit the reflecting layer from being altered, deteriorating, and decreasing in reflectance. The glass layer 3 is more highly isolating against oxygen, moisture, or the like than a common resin is, and therefore can suppress a change over time in the silver reflecting layer 2.

It is here possible to place a heat sink (not illustrated) on the underside of the LTCC substrate 11 of the light-emitting apparatus 1003. In such a case, it is preferable that the heat-radiating vias 21 be in contact with the heat sink.

Embodiment 5

Figure 10:
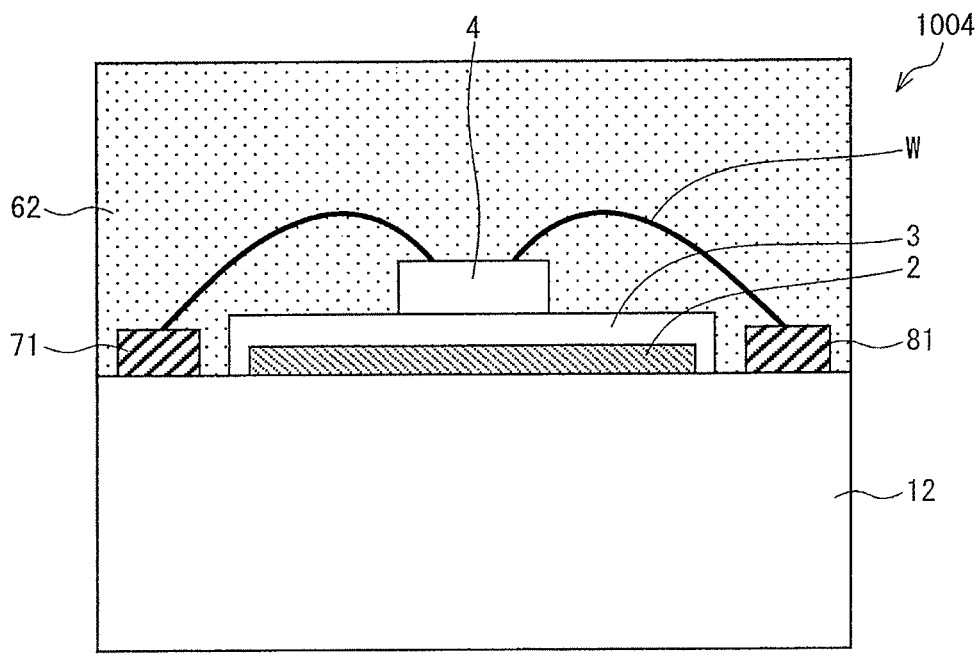
FIG. 10 is a cross-sectional view schematically illustrating a light-emitting apparatus according to still another embodiment of the present invention.
Figure 11:
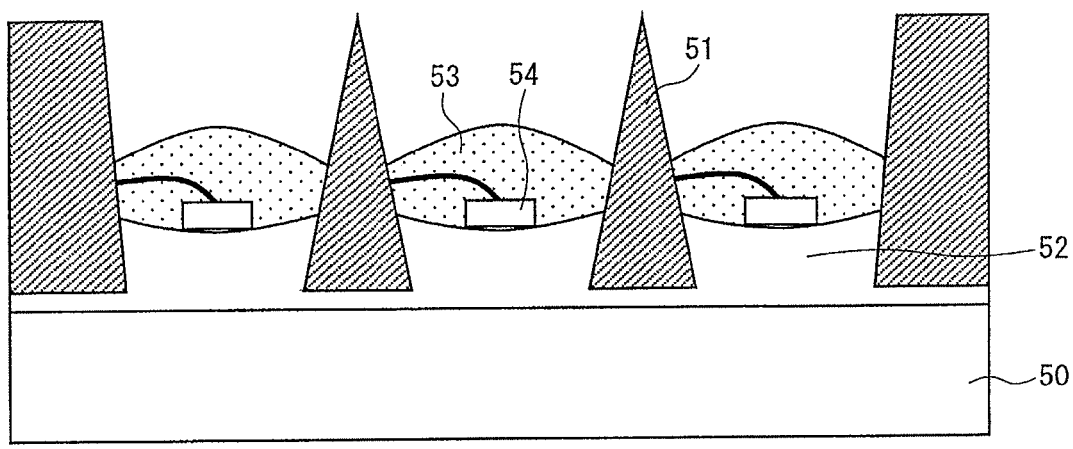
FIG. 11 is a cross-sectional view schematically illustrating a conventional light-emitting apparatus.
Figure 12:
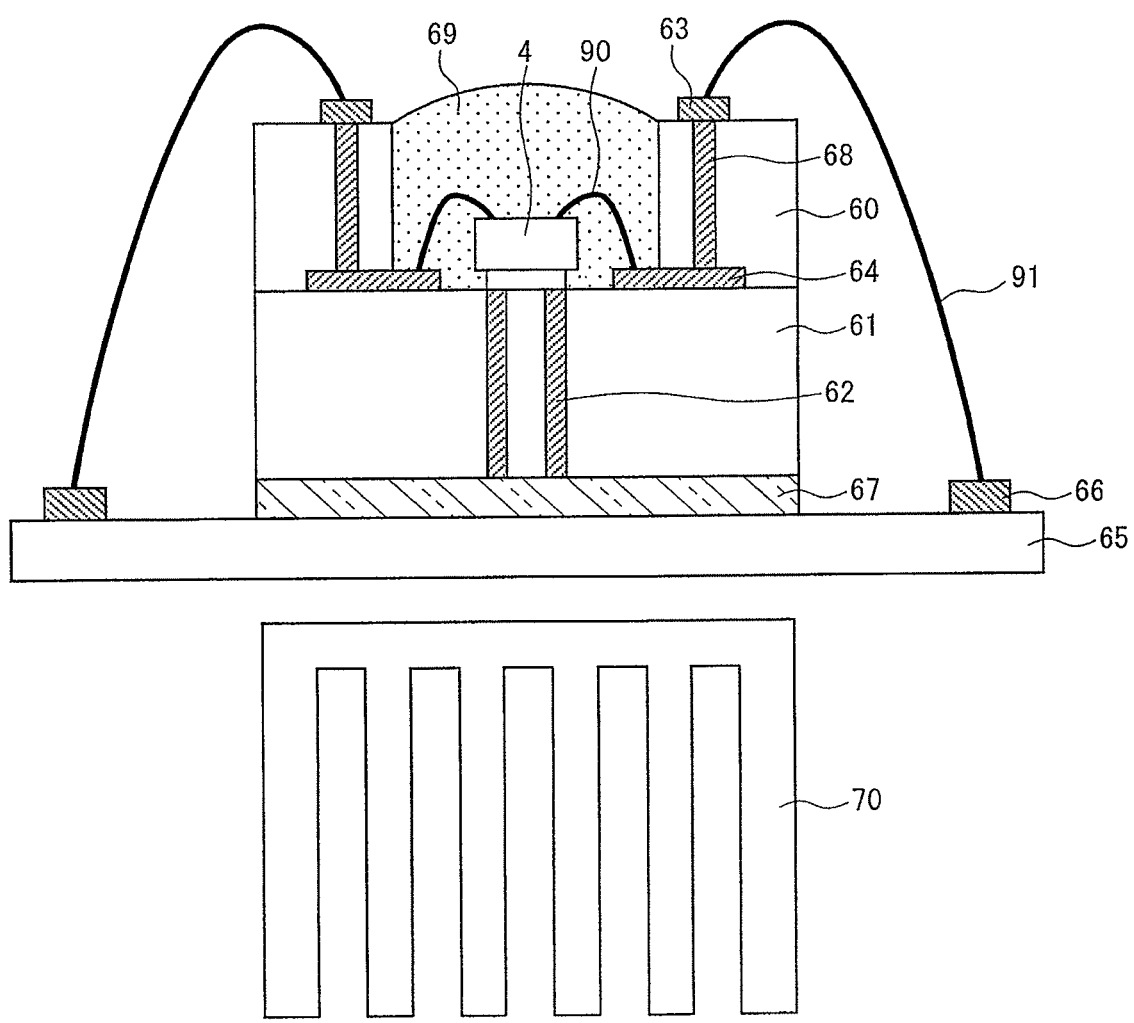
FIG. 12 is a cross-sectional view schematically illustrating a conventional light-emitting apparatus.

FIG. 10 is a cross-sectional view schematically illustrating a light-emitting apparatus 1004 according to another embodiment of the present invention. For convenience of explanation, members having the same functions as those used in Embodiment 4 are given the same reference numerals, and will not be described below. The light-emitting apparatus 1004 includes: an alumina substrate 12; a silver reflecting layer 2 formed on the alumina substrate 12; a glass layer 3 covering only the silver reflecting layer 2; LED chips 4 placed on the glass layer 3; and positive and negative electrode external connection terminals 81 and 71 formed on the alumina substrate 12. The LED chips 4 are electrically connected to each of the external connection terminals 81 and 71 via bonding wires W. The LED chips 4, the bonding wires W, and the external connection terminals 81 and 71 are sealed with a luminescent material-containing sealing resin 62; however, the luminescent material-containing sealing resin 62 does not cover the whole surface of the alumina substrate 12 across the depth of FIG. 10. The alumina substrate 12 has unsealed regions thereon via which the positive and negative external connection lands 81 and 71 are exposed to enable connection to an external power supply (not illustrated). The present embodiment has 36 LED chips 4 placed therein. However, for simplicity, FIG. 10 shows a cross-section of a single LED chip.

The following shows a method for manufacturing a light-emitting apparatus 1004.

Step (1): On an alumina substrate 12 (thickness 2 mm), a silver film 2 (thickness 0.2 mm) is formed by plating, whereby a silver reflecting layer 2 is formed.

Step (2): On the silver reflecting layer 2, a glass layer 3 (thickness 0.006 mm) is formed. It should be noted here that the glass layer 3 is made of transparent borosilicate glass ($Na_2O$—$B_2O_3$—$SiO_2$) with use of a doctor blade method.

Step (3): On the alumina substrate 12, external connection terminals 71 and 81 (thickness 0.7 mm, width 0.45 mm, length 2 mm) are formed by screen printing.

Step (4): On the glass layer 3, LED chips 4 (shorter-side width 0.24 mm, longer-side width 0.48 mm, thickness 0.14 mm, quantity 36) are fixed with use of silicone resin (not illustrated). Next, the LED chips 4 and the external connection terminals 71 and 81 are electrically connected with use of bonding wires W.

Step (5): Next, a sealing resin (silicone) 62 containing a luminescent material (Eu:BOSE) is injected, and the luminescent material-containing sealing resin 62 is cured by heat. The luminescent material-containing sealing resin 62 is formed by keeping a mixture of a luminescent material and silicone resin that is a transparent resin at 150° C. over 30 minutes and curing the resin. It should be noted that, in the present embodiment, the luminescent material-containing sealing resin 62 is formed so as to give off light corresponding to the point (x,y)=(0.345,0.35) on the CIE chromaticity diagram. Thus, the light-emitting section is manufactured.

Further, in the present embodiment, the silver reflecting layer 2 is covered with the glass layer 3. This makes it possible to inhibit the reflecting layer from being altered, deteriorating, and decreasing in reflectance. The glass layer 3 is more highly isolating against oxygen, moisture, or the like than a common resin is, and therefore can suppress a change over time in the silver reflecting layer 2.

Further, it is preferable that the external connection terminals 81 and 71 on the glass layer 3 be made of a material containing gold, which is chemically stable.

In each of the embodiments, examples of the glass powder of which the glass layer and the LTCC substrate are made encompass silica glass, soda-lime glass, borosilicate glass, aluminoborosilicate glass, borosilicate zinc glass, aluminosilicate glass, and/or phosphate glass. Particular preference is given to borosilicate glass.

Further, examples of the ceramic powder of which the LTCC substrate is made encompass $SiO_2$, $Al_2O_3$, $ZrO_2$, $TiO_2$, ZnO, $MgAl_2O_4$, $ZnAl_2O_4$, $MgSiO_3$, $MgSiO_4$, $Zn_2SiO_4$, $Zn_2TiO_4$, $SrTiO_3$, $CaTiO_3$, $MgTiO_3$, $BaTiO_3$, $CaMgSi_2O_6$, $SrAl_2Si_2O_8$, $BaAl_2Si_2O_8$, $CaAl_2Si_2O_8$, $Mg_2Al_4Si_5O_{18}$, $Zn_2Al_4Si_5O_{18}$, MN, SiC, mullite, and zeolite. Further, the LTCC substrate can be replaced by a substrate based on ceramic.

The sealing resin is suitably made of either (i) a highly weather-resistant transparent resin such as epoxy resin, urea resin, or silicone resin, or (ii) a highly light-resistant translucent inorganic material such as silica sol or glass. Further, the sealing resin may contain a diffusing agent together with the luminescent material. A suitably usable specific example of the diffusing agent is barium titanate, titanium oxide, aluminum oxide, silicon oxide, calcium carbonate, silicon dioxide, or the like.

The LED chips are blue LED chips each including a sapphire substrate and gallium nitride-based light-emitting section formed on the sapphire substrate.

A suitably usable example of the luminescent material is a Ce:YAG (cerium-activated yttrium-aluminum-garnet) luminescent material, a Eu:BOSE or SOSE (europium-activated strontium-barium-orthosilicate) luminescent material, a europium-activated a sialon luminescent material, or the like.

It should be noted that it is possible to drip a molding sealing resin in forming the resin sealer (luminescent material-containing sealing resin). Further, it is possible to form the resin sealer with use of a mold, and the resin sealer can be shaped, for example, into an upwardly convex hemisphere so as to function as a lens.

It should be noted here that the LED chips can be joined with a thermosetting resin (adhesive resin) or the like. Specific examples include silicone resin, epoxy resin, acrylic resin, and imide resin.

In each of the embodiments described above, the LED chips used are blue LED chips each composed of a gallium nitride-based compound semiconductor. However, the LED chips used may be blue LED chips each composed of a ZnO (zinc oxide)-based compound semiconductor. Alternatively, the LED chips used may be LED chips of an InGaAlP- or AlGaAs-based compound semiconductor.

In each of the embodiments, each of the LED chips has P- and N-side electrodes formed on one surface thereof and the surface serves as an upper surface to which two bonding wires are connected. However, the LED chip is not necessarily connected in such a way. It is possible to form a wire on the glass layer and connect the LED chip directly to the wire, for example, by soldering. Further, although the LED chips have been described as emitting blue light, the color of light that is emitted by the LED chips is not limited to blue. For example the LED chips may emit ultraviolet light or green light. Further, although a method to obtain white by converting, with a luminescent material, light emitted by the LED chips has been described, it is possible to obtain a color required for illumination, such as white or the color of light emitted by a light bulb, by using three-color (red, green, and blue) LED chips instead of using a luminescent material.

Embodiment 6

Light-Emitting Apparatus

Figure 13:
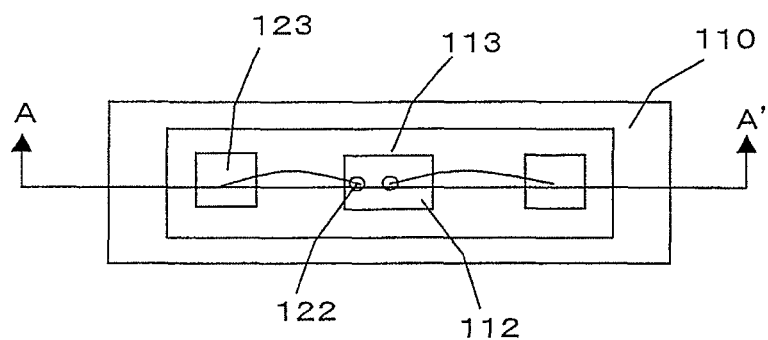
FIG. 13 (a) is a plan view schematically illustrating a structure of a light-emitting apparatus according to still another embodiment of the present invention.
Figure 13:
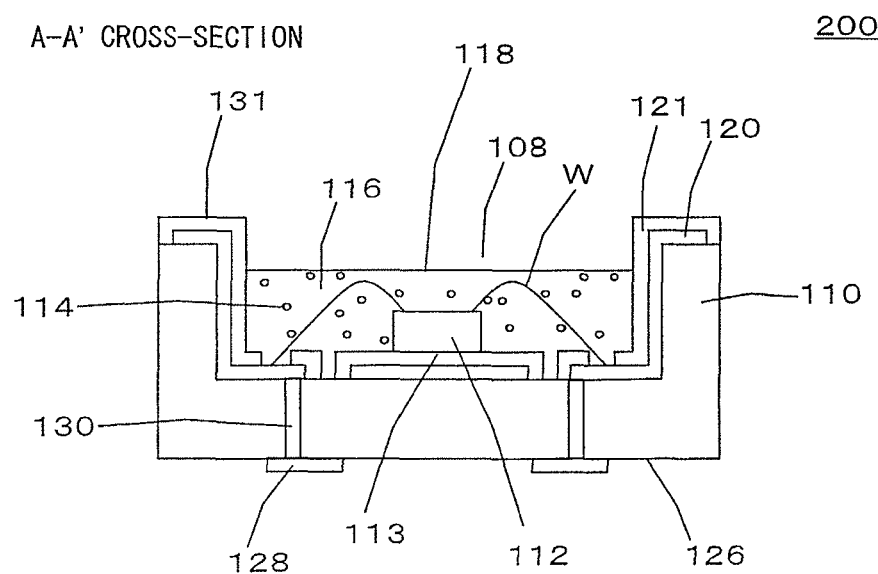

FIGS. 13(a) and 13(b) shows a plan view and a cross-sectional view, respectively, illustrating a structure of a light-emitting apparatus of Embodiment 6. In FIG. 13(b), the light-emitting apparatus 2001 includes: a package 110 including a cup-shaped depressed portion 108; an LED chip 112; and a luminescent material 114. The LED chip 112 is die-bonded to a chip-mounting portion 113 located substantially in the center of the bottom surface of the depressed portion 108. The LED chip 112 is covered with a sealing resin 116 in which the luminescent material 114 has been dispersed. The LED chip 112 emits primary light (e.g., blue light, having a luminescence peak in a blue-wavelength region, whose wavelength ranges from not less than 400 nm to not more than 500 nm). The luminescent material 114 emits secondary light (e.g., yellow light, having a luminescence peak in a yellow-wavelength region, whose wavelength ranges from not less than 550 nm to not more than 600 nm) when excited by the primary light. The primary light and the secondary light are mixed together so as to be emitted as white light from an exit face 118 facing toward an open side of the depressed portion 108.

The internal and bottom surfaces of the depressed portion 108 are covered with a silver reflecting layer 120 made of metal such as Ag, so as to have high reflectance, and are further covered with a glass layer 121 so that the reflectance can be maintained for a long period of time.

In FIG. 13(a), the bottom surface of the depressed portion 108 includes a pair of electrode pads 123. The pair of electrode pads 123 are formed by spacing one portion of the silver reflecting layer 120 from another. The LED chip 112 is die-bonded to the chip-mounting portion 113, and the electrode pads 122 of the LED chip 112 and the electrode pads 123 of the package 110 are electrically connected by wire bonding. It should be noted that each of the electrode pads 123 has a portion to which a wire W is connected and whose surface is exposed, and is not covered with the glass layer 121.

In FIG. 13(b), the lower surface of the light-emitting apparatus 2001 is a mounting surface 126 that faces a mounted substrate (not illustrated), and the mounting surface 126 has external connection terminals 128 formed thereon, with conducting vias 130 interposed between the electrode pads 123 and the external connection terminals 128. The vias 130 form a current pathway to the LED chip 112 when the external connection terminals 128 are connected to a wiring pattern formed on the mounted substrate.

(Manufacturing Method)

Figure 14:
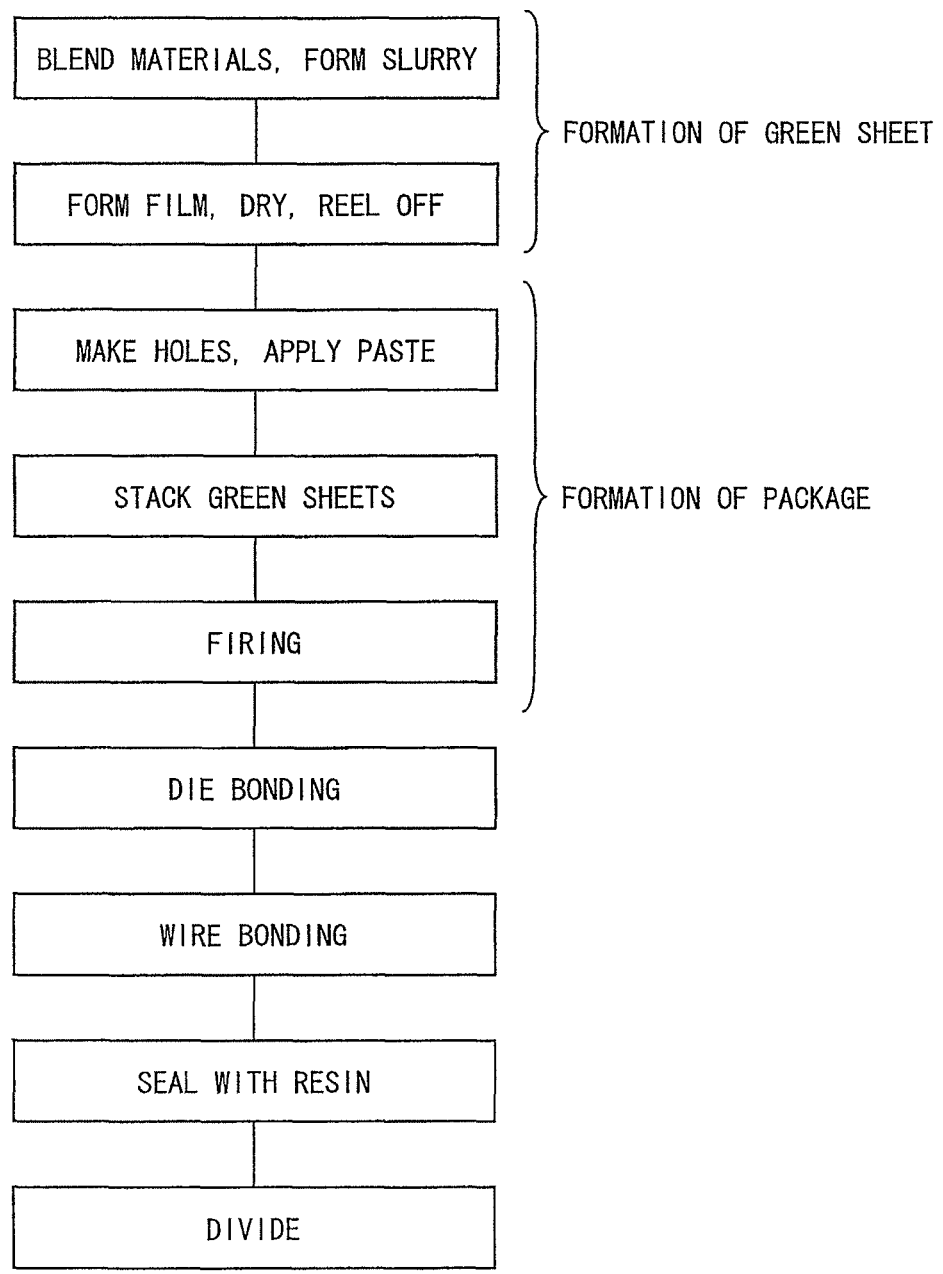
FIG. 14 is a flow chart illustrating a method for manufacturing a light-emitting apparatus.

The following describes a method for manufacturing a light-emitting apparatus 2001. FIG. 14 is a flow chart illustrating a method for manufacturing a light-emitting apparatus. FIGS. 15(a) through 15(d) are cross-sectional views illustrating how a stack is arranged. FIGS. 16(a) through 16(d) are cross-sectional views illustrating a method for manufacturing a light-emitting apparatus.

The following first describes a method for forming a package. A package according to the present embodiment is a low temperature co-fired ceramic (LTCC) package. The package is formed by firing a stack of sheet-like materials, called green sheets, which have been subjected, for example, to a process of making holes in the green sheets and a process of filling the holes with paste.

The following first describes a method for forming a green sheet 150. Material called slurry is prepared by blending an organic binder and a solvent with a main material, i.e., a mixture of alumina ceramic powder and glass, and by uniformly dispersing the organic binder and the solvent in the mixture. Next, the slurry is applied onto a PET film by a film-forming apparatus so as to have a given thickness, and then reeled off after a drying step. Thus obtained is a green sheet 150. Next, the green sheet 150 is cut to a predetermined size, and then subjected, for example, to a process of making holes in those portions of the green sheet 150 in which components of a package 110 such as a depressed portion 108, vias 130, electrode pads 123, and a glass layer 121 are to be formed and a process of filling the holes with paste. A plurality of such green sheets 150 are aligned with one another and stacked. Thus formed is a stack 155 (FIG. 15(d)).

Figure 15:
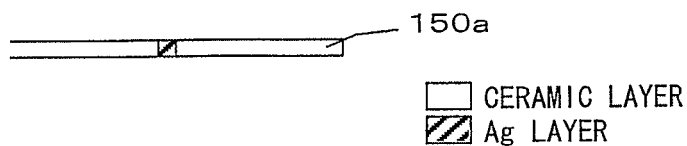
FIGS. 15(a) through 15(d) are cross-sectional views illustrating how a stack is arranged.
Figure 15:
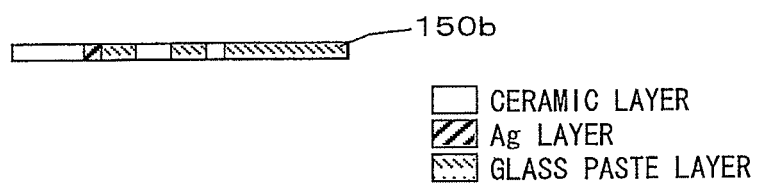
Figure 15:
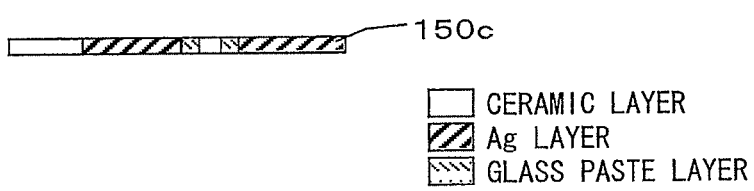
Figure 15:
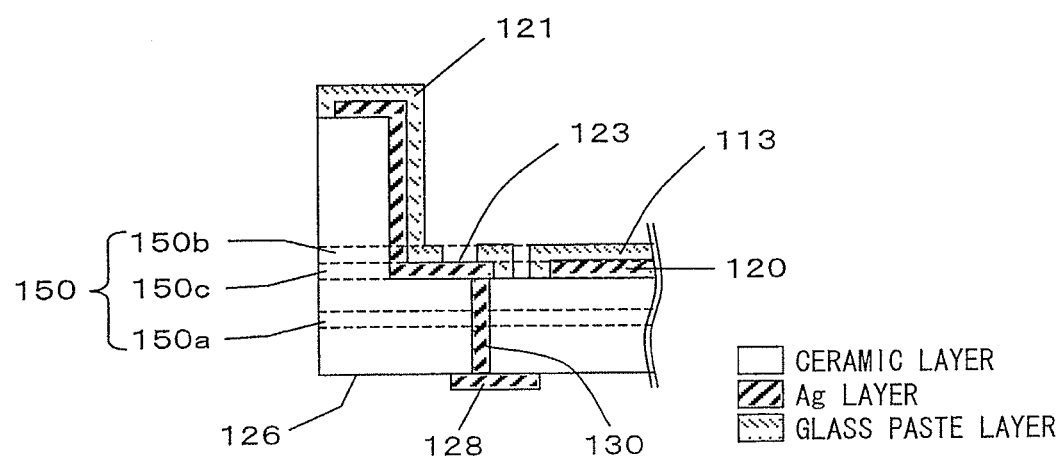
Figure 16:
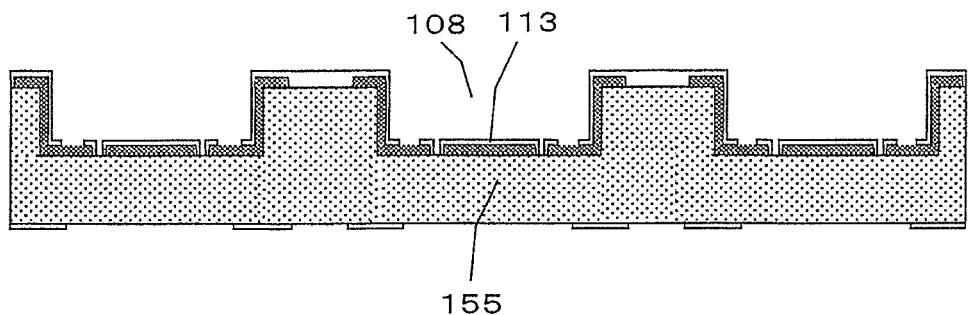
FIGS. 16(a) through 16(d) are cross-sectional views illustrating a method for manufacturing the light-emitting apparatus.
Figure 16:
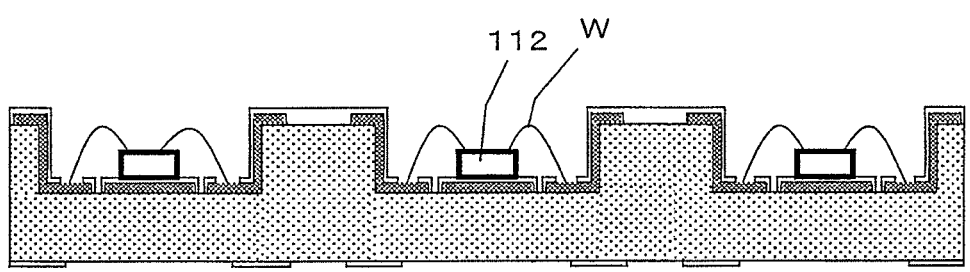
Figure 16:
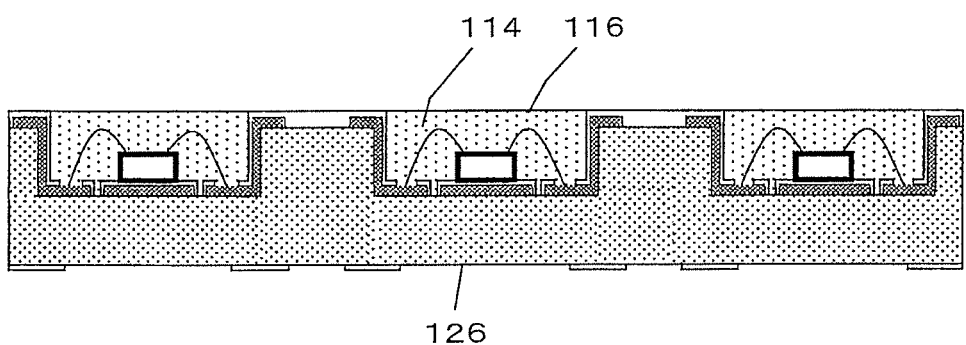
Figure 16:
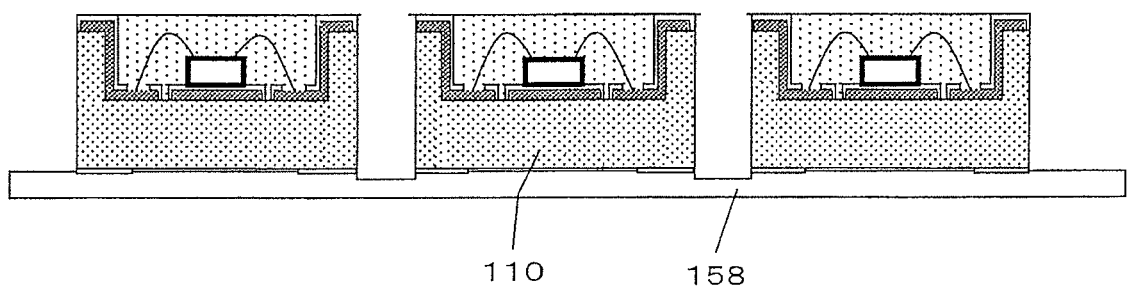

For example, as illustrated in FIGS. 15(a) through 15(d), the via 130, the electrode pad 123, and the chip-mounting portion 113 are formed by stacking green sheets (FIG. 15(a)) whose holes have been filled with metal paste in which metal such as Ag has been dispersed. The metal paste is conductive between vertically adjacent layers, so that the electrode pad 123 and the external connection terminal 128 are electrically conductive with each other. Further, the pair of electrode pads 123 are spaced from each other so as to be insulated and separated from each other.

The glass layer 121 is formed by lamination or adhesion of a layer of glass paste onto a layer of metal paste. For example, the glass layer 121 is formed by covering the silver reflecting layer 120 with a green sheet (FIG. 15(b)) whose hole has been filled with glass paste to form a chip-mounting portion 113.

It should be noted that each of the electrode pads 123 has a surface exposed without being covered with glass. This portion is formed by stacking a green sheet (FIGS. 15(b) and 15(c)) having a hole, provided in a portion filled with glass paste, via which the surface of the electrode pad 123 is to be exposed. Since the surface of the electrode pad 123 is exposed, preference is given to material that is hard to be altered, and the metal paste is preferably made of Au paste or the like.

In order that a plurality of packages 110 are formed simultaneously, a green sheet 150 is formed repeatedly with a plurality of processed patterns subjected to a process of making holes and a process of filling the holes with paste.

Next, the stack 155 is fired at 700° C. to 1,000° C., e.g., at 850° C. to 900° C., whereby the alumina powder of which the green sheets 150 are made, the metal paste of which the silver reflecting layer 120 is made, the glass paste covering the silver reflecting layer 120, the Au paste of which the electrode pads 123 are made are co-fired, with the result that a package 110 is completed. At this time, the glass component contained in the glass paste is melted to smoothly cover a surface of the silver reflecting layer 120. Further, the co-firing of the raw materials brings about an effect of alleviating stress on the interface between one layer and another.

It should be noted that the layers constituting the package 110 can be formed, for example, so that the layer extending from the chip-mounting portion 113 to the mounting surface 126, the silver reflecting layer 120, and the glass layer 121 have a thickness of 0.5 mm, a thickness of 0.005 mm, and a thickness of 0.01 mm, respectively.

Referring to FIGS. 16(a) through 16(d), the following describes steps to be taken after an LED chip 112 is mounted. It should be noted that FIGS. 16(a) through 16(d) do not illustrate a via 130.

Brazing material (not illustrated) such as silicone paste is applied to the chip-mounting portion 113 of each depressed portion 108 of a stack 155 that has been fired, and then an LED chip 112 are die-bonded onto the chip-mounting portion 113. Next, the electrode pads 122 of the LED chip 112 and the electrode pads 123 of the package 110 are connected by wire bonding, respectively. At this time, the electrode pads 123 of the package 110 have not been covered with glass, and therefore can be wire-bonded satisfactorily (FIGS. 16(a) and 16(b)).

Next, the depressed portion 108 is filled with a sealing resin 116 in which a luminescent material 114 has been dispersed in advance, and the sealing resin 116 is cured, whereby the LED chip 112 is covered. The sealing resin 116 can be suitably made of dimethyl silicone or methyl rubber, which is highly heat-resistant and highly adhesive to glass. For example, in cases where KER2500 (manufactured by Shin-Etsu Chemical Co., Ltd.) is used as dimethyl silicone, the sealing resin is cured at 100° C. for 60 minutes, and after-cured at 150° C. for 300 minutes. Dimethyl silicone and methyl rubber are lower in gas sealing properties than organic modified silicone or the like. However, since the surface of the silver reflecting layer 120 is covered with glass, the surface can be inhibited from being altered.

Finally, the stack 155 is divided into individual light-emitting apparatuses. The division is performed, for example, by using a UV sheet, i.e., by attaching a UV sheet 158 to the mounting surface 126, placing the stack 155 on a stage, and dicing the stack 155 along predetermined positions. Next, the adhesive of the UV sheet 158 is cured by UV light irradiation, and then the individual pieces are separated from one another.

According to the aforementioned arrangement, because of a high degree of adhesion between dimethyl silicone or methyl rubber and glass, the sealing resin 116 can be inhibited from being detached from the glass layer 121 covering the silver reflecting layer 120. A possible reason for the high degree of adhesion is that the glass surface has a hydroxyl group exposed thereon and therefore has high binding force with respect to silicone resin. Another possible reason is that dimethyl silicone and methyl rubber are higher in elasticity than organic modified silicone or the like and therefore easily absorb a change in volume such as thermal expansion or contraction.

Further, it is preferable that the sealing resin 116 has a continuously allowable temperature limit of not less than 120° C. It should be noted here that in cases where the thermal resistance of a package 110 is 200° C./W and the heat of an LED chip 112 is 0.06 W, the rise in temperature of the package 110 is at most 12° C. However, the light-emitting apparatus 2001 is required to serve for a very long period of time, e.g., 40,000 hours. For the purpose of satisfying such reliability, such a continuously allowable temperature limit as above is required.

It should be noted that the luminescent material 114 can be suitably realized, for example, by BOSE (Ba, O, Sr, Si, Eu) or the like. Alternatively, the luminescent material 114 can be suitably realized by SOSE (Sr, Ba, Si, O, Eu), YAG (cerium-activated yttrium-aluminum-garnet), a sialon ((Ca), Si, Al, O, N, Eu), β sialon (Si, Al, O, N, Eu), or the like, as well as BOSE. Further, when the LED chip 112 is realized by using an ultraviolet (near-ultraviolet) LED, for example, whose peak wavelength ranges from 390 nm to 420 nm, instead of using a blue LED, a further improvement in luminous efficiency can be achieved.

As stated above, a light-emitting apparatus 2001 including a silver reflecting layer 120 and a glass layer 121 covering the silver reflecting layer 120 and sealed with silicone resin is highly reliable because of a combination of high gas sealing properties, high heat resistance, and a high degree of adhesion.

The present embodiment is arranged such that the sealing resin 116 has a luminescent material 114 dispersed therein, but is not necessarily limited to this. For example, the present embodiment may be arranged such that the sealing resin 116 covers a luminescent material 114 covering only the vicinity of an LED chip 112, or may be arranged such that the sealing resin 116 does not include a luminescent material 114. Further, although the silver reflecting layer 120 is formed not only on the inner wall of the depressed portion 108 but also on a portion corresponding to a bank 131 circularly surrounding the periphery of the exit face 118, the present embodiment may be arranged such that the silver reflecting layer 120 is not formed on the portion corresponding to the bank 131. In other words, as long as the present embodiment is arranged such that the glass layer 121 is interposed between the sealing resin 116 and the surface of the silver reflecting layer 120 on the package 110, an improvement in reliability can be achieved.

Embodiment 7

Figure 17:
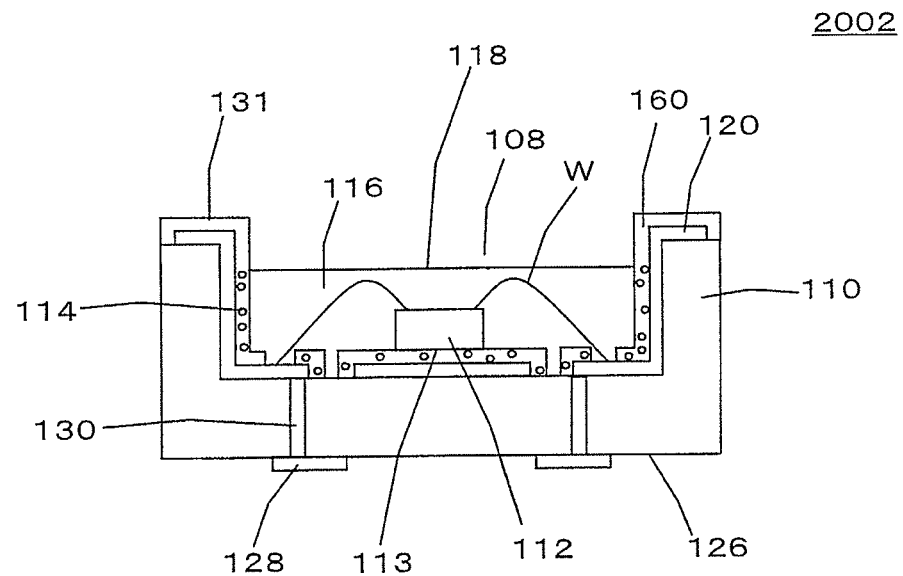
FIG. 17 is a cross-sectional view schematically illustrating a structure of a light-emitting apparatus according to still another embodiment of the present invention.

FIG. 17 is a cross-sectional view illustrating a structure of a light-emitting apparatus of Embodiment 7. The light-emitting apparatus 2002 includes a luminescent material-containing glass layer 160 in which a luminescent material 114 has been dispersed, instead of including a glass layer 121. The primary light, which is blue light emitted by an LED chip 112, and the secondary light, which is yellow light emitted by the luminescent material 114 being excited by the primary light, are mixed together so as to be emitted as white light from an exit face 118 facing toward an open side of the depressed portion 108.

The light-emitting apparatus 2002 is equivalent to Embodiment 6 except that the luminescent material-containing glass layer 160 is formed by lamination or adhesion of a layer of luminescent material-containing glass paste onto a layer of metal paste. It should be noted that the luminescent material-containing glass paste is obtained by dispersing the luminescent material 114 such as the aforementioned BOSE, SOSE, YAG, α sialon, or β sialon in glass powder.

According to the present embodiment, since the luminescent material 114 hardly settles at the bottom of the luminescent material-containing glass paste, the density of the luminescent material 114 in the luminescent material-containing glass layer 160 can be further uniformed. This makes it possible to suppress variations in chromaticity of emitted light. A possible reason for the little sedimentation of the luminescent material 114 is that the glass powder contained in the luminescent material-containing glass paste exhibits a function of suppressing sedimentation of the luminescent material 114.

In FIG. 17, the sealing resin 116 has no luminescent material 114 dispersed therein. However, the sealing resin 116 can be arranged to have a luminescent material 114 dispersed therein.

Further, the luminescent material-containing glass layer 160 can be formed to wholly or partially contain a luminescent material. Preferably, as illustrated in FIG. 17, the luminescent material-containing glass layer 160 is formed to contain a luminescent material in a portion making contact with the sealing resin 116 and to contain no luminescent material in the portion corresponding to the bank 131. This makes it possible to inhibit the luminescent material 114 from being excited by external light on the bank 131 to emit yellow light.

Embodiment 8

Figure 18:
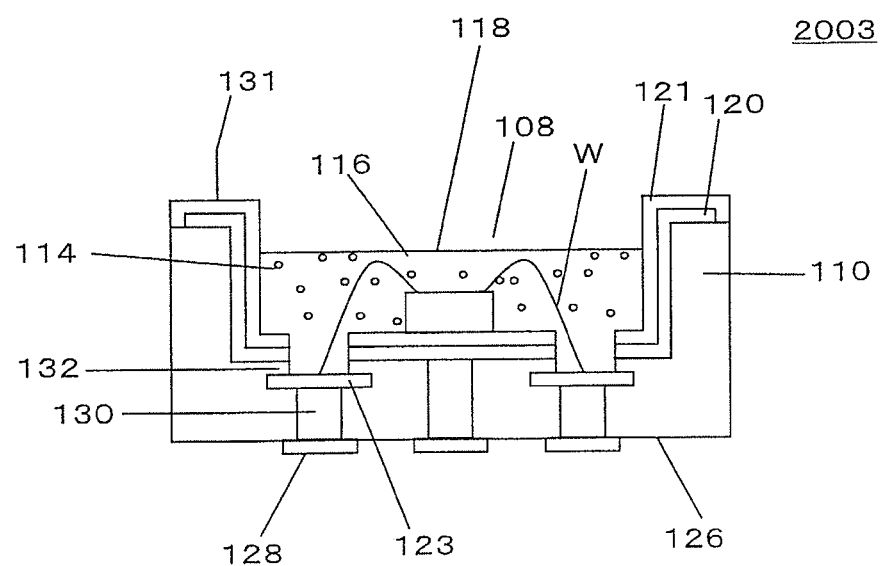
FIG. 18 is a cross-sectional view schematically illustrating a structure of a light-emitting apparatus according to still another embodiment of the present invention.

FIG. 18 is a cross-sectional view illustrating a structure of a light-emitting apparatus of Embodiment 8. The present embodiment is characterized in that the bottom surface of the depressed portion 108 of the package 110 is provided with recessed areas, that a bottom surface of each of the recessed areas is formed with an electrode pad 123, and that an insulating layer 132 is interposed between the electrode pad 123 and the silver reflecting layer 120. The present embodiment is otherwise equivalent to Embodiment 6.

In the vicinity of each electrode pad 123 of the package 110, the ceramic of which the package 110 is made is exposed in order to insulate one of the electrode pads 123 from the other by surrounding each electrode pad 123. Therefore, this area leaks a portion of emitted light, thus causing a decrease in emission efficiency. In the light-emitting apparatus 2001 of Embodiment 6, the exposed portion of the ceramic is formed at substantially the same level as the chip-mounting portion 113. Meanwhile, in the present embodiment, the exposed portion of the ceramic exists in a further recessed part of the recessed area that is hard for emitted light to reach. This inhibits light from leaking from the exposed portion of the ceramic in the vicinity of each electrode pad 123, thus making it possible to achieve an improvement in efficiency with which light is taken out.

Embodiment 9

Figure 19:
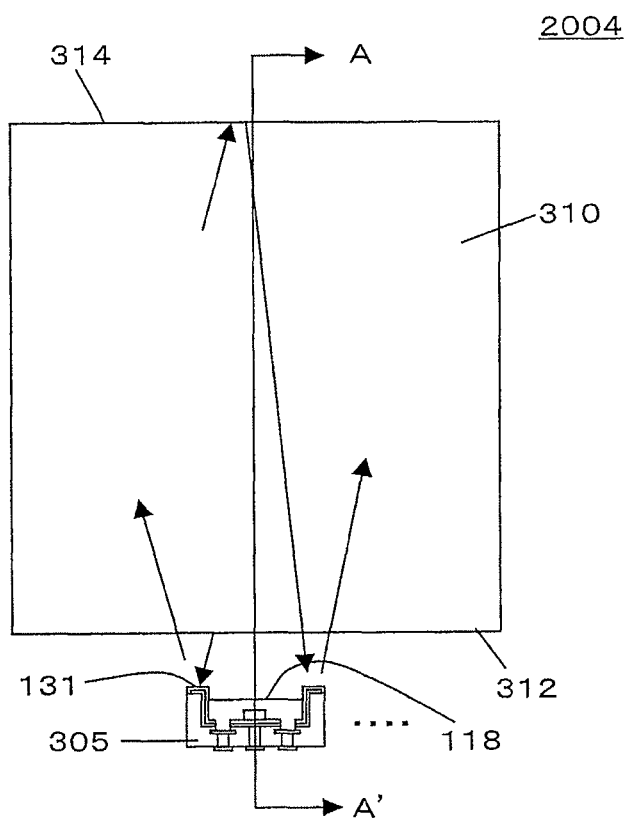
FIG. 19(a) is a pattern diagram illustrating a structure of a surface light source according to still another embodiment of the present invention.
FIG. 19(b) is a cross-sectional view taken along the line A-A' of FIG. 19(a).
Figure 19:
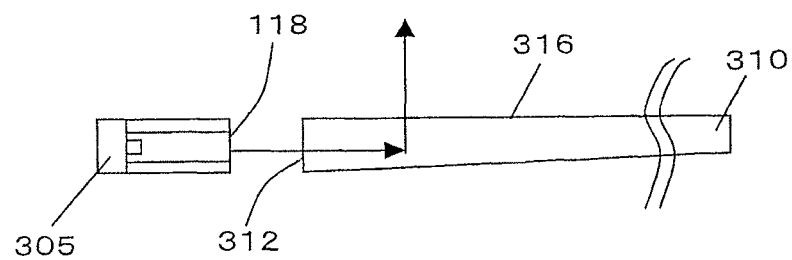

FIGS. 19(a) and 19(b) are pattern diagrams illustrating a structure of a surface light source of Embodiment 9. The surface light source 2004 in the present embodiment includes: a light-emitting apparatus 305 arranged as set forth in any one of Embodiments 6 to 8; and an optical waveguide 310 that guides light emitted by the light-emitting apparatus 305 and causes the light to be emitted by an exit face 316 in the form of plane emission, the light-emitting apparatus 305 having an exit face 118 disposed just in front of an entrance end face 312 of the optical waveguide 310. It should be noted that refraction or the like on the entrance end face 312 of the optical waveguide 310 is omitted from the illustrations.

The light emitted by the light-emitting apparatus 305 illuminates the entrance end face 312, but is partially reflected by the entrance end face 312 and a dead end face 314 of the optical waveguide 310 and returned to the exit face 118 of the light-emitting apparatus 305. Meanwhile, the silver reflecting layer 120 of the light-emitting apparatus 305 is formed not only on the inner wall of the depressed portion 108 but also on a portion corresponding to a bank 131 circularly surrounding the periphery of the exit face 118. Therefore, a reflection of emitted light reflected by the entrance end face 312 of the optical waveguide 310 and a return of emitted light reflected back from the dead end face 314 of the optical waveguide 310 can be again reflected to be incident. This results in an increase in efficiency in the use of light.

The present invention can be applied to an illuminating apparatus or a backlight of a liquid crystal display.

A light-emitting apparatus according to an embodiment of the present invention has (i) at least one semiconductor device which emits light toward a higher position than a substrate and (ii) a plurality of external connection terminals, and includes: a light-reflecting layer, provided on the substrate, which reflects the light emitted by the at least one semiconductor device; and a covering layer which covers at least the light-reflecting layer and which transmits the light reflected by the light-reflecting layer. The at least one semiconductor device is provided on the covering layer, and is electrically connected to the external connection terminals via connecting portions, and the at least one semiconductor device and the connecting portions are sealed with a sealing resin so as to be covered.

According to the foregoing arrangement, the light-reflecting layer reflects light emitted by the semiconductor device toward a lower position (toward the substrate), thereby enabling effective use of the emitted light with a reduction in loss of the emitted light. This makes it possible to increase the amount of light that is emitted by the light-emitting apparatus, and the covering of the light-reflecting layer with the covering layer brings about an effect of inhibiting the light-reflecting layer from being altered or deteriorating and, furthermore, from decreasing in reflectance due to the alteration or deterioration.

It is preferable that the light-reflecting layer have an optical reflectance of not less than 90%.

According to the foregoing arrangement, the high optical reflectance of the light-reflecting layer enables an increase in the amount of light that is emitted by the light-emitting apparatus.

It is preferable that the light-reflecting layer be made of silver or a silver alloy composed mainly of silver.

According to the foregoing arrangement, the formation of the light-reflecting layer from silver or a silver alloy causes heat generated by the semiconductor device to be diffused in a direction along a surface of the substrate, thus enabling an enhancement in heat radiation properties of the light-emitting apparatus. This makes it possible to inhibit a color shift from being caused by heat generated by the light-emitting apparatus.

In an embodiment of the light-emitting apparatus, the substrate may be based on ceramic. Furthermore, the substrate may be based on low temperature co-fired ceramic.

Since the low temperature co-fired ceramic is higher in thermal conductivity than a common organic material, the foregoing arrangement enables a further enhancement in heat radiation properties of the light-emitting apparatus, thus making it possible to integrate semiconductor devices.

In an embodiment of the light-emitting apparatus, it is preferable that the substrate be a product of firing of glass powder and ceramic powder as materials. The glass powder can be realized by glass powder containing silica glass, soda-lime glass, borosilicate glass, aluminoborosilicate glass, borosilicate zinc glass, aluminosilicate glass, or phosphate glass. Further, the ceramic powder can be realized by ceramic powder containing $SiO_2$, $Al_2O_3$, $ZrO_2$, $TiO_2$, ZnO, $MgAl_2O_4$, $ZnAl_2O_4$, $MgSiO_3$, $MgSiO_4$, $Zn_2SiO_4$, $Zn_2TiO_4$, $SrTiO_3$, $CaTiO_3$, $MgTiO_3$, $BaTiO_3$, $CaMgSi_2O_6$, $SrAl_2Si_2O_8$, $BaAl_2Si_2O_8$, $CaAl_2Si_2O_8$, $Mg_2Al_4Si_5O_{18}$, $Zn_2Al_4Si_5O_{18}$, AlN, SiC, mullite, or zeolite.

In an embodiment of the light-emitting apparatus, the covering layer is made of glass, and the glass can be realized by glass containing silica glass, soda-lime glass, borosilicate glass, aluminoborosilicate glass, borosilicate zinc glass, aluminosilicate glass, or phosphate glass.

According to the foregoing arrangement, the substrate and the covering layer contains glass powder. This improves adhesion between the substrate and the covering layer and further inhibits a change over time from being caused by deterioration or the like in the light-reflecting layer, thus enabling suppression of a decrease in reflectance. In particular, borosilicate glass ($NA_2O$—$B_2O_3$—$SiO_2$) is low in coefficient of thermal expansion, high in thermal shock temperature, and highly chemically resistant because of its high content of boron oxide, thus being further highly effective in protecting the light-reflecting layer.

In an embodiment of the light-emitting apparatus, the at least one semiconductor chip may be a light-emitting diode chip. The covering layer may be made of glass. The connecting portions may include wiring patterns and bonding wires. The wiring patterns may be provided on the substrate or on the covering layer in parallel with one another and at distances from one another. The at least one semiconductor chip may include a plurality of semiconductor chips placed between the wiring patterns. The wiring patterns and the semiconductor devices may be connected via the bonding wires.

The foregoing arrangement makes it possible to freely adjust the number of semiconductor devices, thus making it easy to adjust the luminance of the light-emitting apparatus, to adjust the chromaticity of the light-emitting apparatus, and to take measures against heat generated by the light-emitting apparatus.

In an embodiment of the light-emitting apparatus, it is preferable that the substrate contain heat-radiating vias, made of metal, which are joined to the light-reflecting layer, the external connection terminals, or both.

According to the foregoing arrangement, the heat-radiating via connected to the light-reflecting layer or the external connection terminals enable a further enhancement in heat radiation properties of the light-emitting apparatus.

It is preferable that the heat-radiating vias extend in a direction perpendicular to a surface of the substrate.

Furthermore, it is preferable that the heat-radiating vias be made of silver or a silver alloy composed mainly of silver.

In addition to the radiation of heat by the light-reflecting layer in a direction along a plane of the substrate, the foregoing arrangement enhances radiation of heat in a direction perpendicular to the substrate. This makes it possible to integrate semiconductor devices within a small region.

In an embodiment of the light-emitting apparatus, it is preferable that the wiring patterns be made of gold.

According to the forgoing arrangement, the formation of the wiring patterns from gold makes it possible to inhibit a change over time from being caused by deterioration or the like in the wiring patterns.

In an embodiment of the light-emitting apparatus, it is preferable that a nickel or chrome layer be provided between the wiring patterns and the covering layer.

The foregoing arrangement improves adhesion between the covering layer made of glass and the wiring patterns, thus making it possible to inhibit a change over time from being caused by deterioration or the like in the wiring patterns.

In an embodiment of the light-emitting apparatus, the at least one semiconductor device may be placed on the covering layer via an adhesive resin.

In an embodiment of the light-emitting apparatus, it is preferable that the sealing resin contain a luminescent material.

According to the foregoing arrangement, the luminescent material absorbs light emitted by the semiconductor device and emits light of a different wavelength. This makes it possible to achieve, by using a semiconductor device that emits a single type of light, a light-emitting apparatus that emits a different type of light (e.g., white light).

In an embodiment of the light-emitting apparatus, it is preferable that the sealing resin be constituted by a luminescent material-containing resin section containing a luminescent material and a transparent resin section provided so as to cover the luminescent material-containing resin section.

The foregoing arrangement makes it possible to protect the luminescent material-containing resin section by the transparent resin section.

In an embodiment of the light-emitting apparatus, it is preferable that the sealing resin have a domed contour.

In an embodiment of the light-emitting apparatus, it is preferable that the luminescent material-containing resin section and the transparent resin section both have domed contours.

According to the foregoing arrangement, the sealing resin has no sharp and definite corners pointing in a direction of light radiation, thus causing continuous changes in direction in which irradiating light is refracted. This brings about an effect of making it possible to reduce unevenness in intensity of the irradiating light.

An embodiment of a light-emitting apparatus includes: a light-emitting diode chip; a package, including a chip-mounting portion and a silver reflecting layer which reflects light emitted by the light-emitting diode chip, in which the light-emitting diode chip is die-bonded to the chip-mounting portion; and a sealing resin which covers the light-emitting diode chip, the silver reflecting layer being covered with a glass layer.

In an embodiment of the light-emitting apparatus, it is preferable that the sealing resin be made of dimethyl silicone or methyl rubber.

In an embodiment of the light-emitting apparatus, it is preferable that the sealing resin have a luminescent material dispersed therein for absorbing at least a portion of primary light emitted by the light-emitting diode chip and converting the primary light into secondary light having a longer wavelength than the primary light.

In an embodiment of the light-emitting apparatus, it is preferable that the silver reflecting layer is provided on a periphery of an exit face of the light-emitting apparatus.

In an embodiment of the light-emitting apparatus, it is preferable that the chip-mounting portion be provided with a recessed area whose bottom surface is provided with an electrode pad.

A method according an embodiment of the present invention for manufacturing a package for a light-emitting apparatus includes the steps of: preparing a plurality of green sheets made mainly of alumina; performing a process of making holes in the plurality of green sheets; filling the holes of the plurality of green sheets with at least either metal paste or glass paste; and stacking and firing the plurality of green sheets so that the metal paste is covered with the glass paste, the steps being executed in the order presented.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

The invention claimed is:

1. A light-emitting apparatus comprising:
   a ceramic substrate;
   external terminals provided on said ceramic substrate, said external terminals being exposed;
   a metal radiator located in said ceramic substrate;
   a light-reflecting layer provided on said metal radiator and electrically independent of said external terminals, said light-reflecting layer having a thickness smaller than a thickness of said metal radiator, an underside of said light-reflecting layer having a partial area connected to a top surface of said metal radiator;
   an LED chip electrically connected to said external terminals and provided on a top surface of said light-reflecting layer with an insulator therebetween, wherein the insulator covers the top surface of said light-reflecting layer and a side surface of said light-reflecting layer and transmits light emitted by said LED chip and reflected by said light-reflecting layer;
   a luminescent material-containing resin covering said LED chip; and
   a transparent resin provided on said luminescent material-containing resin, said transparent resin having a domed contour.

2. The light-emitting apparatus of claim 1, wherein said ceramic substrate includes a plurality of ceramic layers.

3. The light-emitting apparatus of claim 2, wherein said metal radiator extends through the ceramic layers along a direction perpendicular to a surface of said ceramic substrate.

4. The light-emitting apparatus of claim 3, wherein
   said ceramic substrate has a rectangular shape, and
   a diameter of said transparent resin is smaller than each of sides of said ceramic substrate.

5. The light-emitting apparatus of claim 4, wherein
   said external terminal has a horizontal portion extending along the surface of said ceramic substrate, and
   said light-reflecting layer and the horizontal portion are opposite to each other.

* * * * *